(12) United States Patent
DiJaili et al.

(10) Patent No.: US 7,046,434 B1
(45) Date of Patent: May 16, 2006

(54) OPTICAL CROSSBAR USING LASING SEMICONDUCTOR OPTICAL AMPLIFIERS

(75) Inventors: Sol P. DiJaili, Moraga, CA (US); Jeffrey D. Walker, El Cerrito, CA (US)

(73) Assignee: Finisar Corporation, Sunnyvale, CA (US)

( * ) Notice: Subject to any disclaimer, the term of this patent is extended or adjusted under 35 U.S.C. 154(b) by 992 days.

(21) Appl. No.: 10/020,527

(22) Filed: Dec. 14, 2001

Related U.S. Application Data

(63) Continuation-in-part of application No. 09/809,812, filed on Mar. 16, 2001.

(60) Provisional application No. 60/274,471, filed on Mar. 9, 2001, provisional application No. 60/255,753, filed on Dec. 14, 2000.

(51) Int. Cl.
*H01S 3/00* (2006.01)

(52) U.S. Cl. ............................ 359/344; 385/16; 385/17

(58) Field of Classification Search ................ 359/344; 385/16, 17
See application file for complete search history.

(56) References Cited

U.S. PATENT DOCUMENTS

| | | | | |
|---|---|---|---|---|
| 3,467,906 | A | 9/1969 | Cornely et al. | ............... 330/4.3 |
| 3,828,231 | A | 8/1974 | Yamamoto | .................... 357/30 |
| 4,794,346 | A | 12/1988 | Miller | ......................... 330/4.3 |
| 5,299,054 | A | 3/1994 | Geiger | ....................... 359/251 |
| 5,305,412 | A | 4/1994 | Paoli | ........................... 385/122 |
| 5,436,759 | A | 7/1995 | Dijaili et al. | ................ 359/333 |
| 5,748,653 | A | 5/1998 | Parker et al. | .................... 372/8 |
| 5,771,320 | A | 6/1998 | Stone | ........................... 385/16 |
| 5,999,293 | A | 12/1999 | Manning | .................... 359/139 |
| 6,061,156 | A | 5/2000 | Takeshita et al. | ........... 359/117 |
| 6,115,517 | A | 9/2000 | Shiragaki et al. | .............. 385/24 |
| 6,128,115 | A | 10/2000 | Shiragaki | ...................... 359/128 |
| 6,317,531 | B1 | 11/2001 | Chen et al. | .................... 385/17 |
| 6,333,799 | B1 | 12/2001 | Bala et al. | ................... 359/128 |
| 6,335,992 | B1 | 1/2002 | Bala et al. | ...................... 385/17 |
| 6,628,858 | B1 * | 9/2003 | Zhang et al. | .................. 385/24 |
| 6,747,793 | B1 * | 6/2004 | Flanders | ...................... 359/344 |

FOREIGN PATENT DOCUMENTS

JP 56006492 1/1981

OTHER PUBLICATIONS

Alcatel, "Alcatel Optronics introduces a Gain-Clamped Semiconductor Optical Amplifier," *Press Release for Immediate Publication* OFC '98, San Jose (Feb. 1998), 1 unnumbered page.

(Continued)

*Primary Examiner*—Mark Hellner
(74) *Attorney, Agent, or Firm*—Workman Nydegger

(57) ABSTRACT

An optical crossbar switch is described that minimizes the number of electrical components and optimizes the conversion between optical and electrical signals. Utilizing various characteristics of lasing semiconductor optical amplifiers, the optical crossbar switch provides optical components in place of traditionally used electrical components. For example, an optical buffer is described that delays an optical signal a sufficient amount of time for a path to be created for the optical signal through the optical crossbar. Additionally, a monitor/detector circuit utilizes a ballast laser signal emitted from a lasing SOA during amplification of an optical signal in order to convert optical routing information to an electrical equivalent. As a result of the multiple uses of lasing semiconductor optical amplifiers, the bandwidth of the described optical crossbar switch is greater than traditional optical crossbar switches currently in use.

47 Claims, 15 Drawing Sheets

OTHER PUBLICATIONS

Diez, S. et al., "Gain-Transparent SOA-Switch for High-Bitrate OTDM Add/Drop Multiplexing," *IEEE Photonics Technology Letters,* vol. 11, No. 1 (Jan. 1999), pp. 60-62.

Diez, S. et al., "Novel Gain-Transparent SOA-Switch for High Bitrate OTDM Add/Drop Multiplexing," ECOC '98, Madrid Spain (Sep. 1998), pp. 461-462.

Diez, S. et al., "All-Optical Switch for TDM and WDM/TDM Systems Demonstrated in a 640Gbit/s Demultiplexing Experiment," *Electronic Letters,* vol. 34, No. 8 (Apr. 16, 1998), pp. 803-805.

Dorgeuille, F. et al., "1.28 Tbit/s Throughout 8/Spl Times/8 Optical Switch Based on Arrays of Gain-Clamped Semiconductor Optical Amplifier Gates," OFCC 2000, Baltimore, MD, Mar. 2000, vol. 4, pp. 221-223.

Dorgeuille, F. et al., "Fast Optical Amplifier Gate Array for WDM Routing and Switching Applications," OFC'09 Technical Digest, pp. 42-44.

Doussiere, P. et al., "Clamped Gain Travelling Wave Semiconductor Optical Amplifier for Wavelength Division Multiplexing Applications," Maui, Hawaii, Sep. 19-23, 1994, New York, IEEE, US, vol. Conf. 14 (Sep. 14, 1994), pp. 185-186.

Evankow, JosephD. et al., "Photonic Switching Modules Designed With Laser Diode Amplifiers," *IEEE Journal on Selected Areas in Communications,* vol. 6, No. 7 (Aug. 1988), pp. 1087-1095.

Fernier, B. et al., "Fast (300 ps) Polarization Insensitive Semiconductor Optical Amplifier Switch With Low Driving Current (70 mA)," Semiconductor Laser Conference, Sep. 1992, pp. 130-131.

Fjelde, T. et al., "Influence of RZ and NRZ Signal Formal on the High-Speed Performance of Gain-Clamped Semiconductor Optical Amplifiers," *Research Center COM,* Lyngby, Denmark, pp. 87-89.

Fouquet, J.E. et al., "Compact, Scalable Fiber Optic Cross-Connected Switches," *Digest of the LEOS Summer Topical Meetings,* San Diego, CA Jul. 1999, pp. 59-60.

Ibrahim, Magdy M., "Photonic Switch Using Surface-Emittng Laser Diode and APD," NRSC '99, Cairo, Egypt, Feb. 1999, pp. D7 1-D7 8.

Jong, Gibong et al., "Gain Optimization in Switches Based on Semiconductor Optical Amplifiers," *Journal of Lightwave Technology,* vol. 13, No. 4 (Apr. 1995), pp. 598-605.

Kitamura, Shotaro, et al., "Spot-Size Converter Integrated Semiconductor Optical Amplifiers for Optical Gate Applications," *IBEE Journal of Quantum Electronics,* vol. 35, No. 7 (Jul. 1999), pp. 1067-1074.

Koyama, F. et al., "Multiple-Quantum-Well GaInAs/GaInAsP Tapered Broad-Area Amplifiers with Monolithically Integrated Waveguide Lens for High-Power Applications," *IEEE Photonics Technology Letters,* vol. 5, No. 8 (Aug. 1993), pp. 916-919.

Leuthold, Juerg et al., "All-Optical Space Switches with Gain and Principally Ideal Extinction Ratios," *IBEE Journal of Quantum Electronics,* vol. 34, No. 4 (Apr. 1998), pp. 622-633.

Luo, G. et al., "Experimental and Theoretical Analysis of Relaxation-Oscillations and Spectral Hole Burning Effects in All-Optical Gain-Clamped EDFA's for WDM Networks," *Journal of Lightwave Technology,* vol. 16, No. 4, (Apr. 1998), pp. 527-533.

McAdams, Larry R. et al., "Linearizing High Performance Semiconductor Optical Amplifiers: Techniques and Performance," LEOS Presentation (1996), Thursday 11:00 AM, pp. 363-364.

Mork, J., et al., "Semiconductor Devices for All-Optical Signal Processing: Just How Fast Can They Go?" LEOS '99, San Francisco, CA, Nov., 1999, vol. 2, pp. 900-901.

Mutalik, Venkatesh G. et al., "Analog Performance of 1310-nm Gain-Clamped Semiconductor Optical Amplifiers," *OFC '97 Technical Digest,* Thursday 11:15 AM, pp. 266-267.

Panajotov, K. et al., "Polarisation Switching in Proton-Implanted VCSELs," *Digest of the LEOS Summer Topical Meetings,* San Diego, CA (Jul. 1999), Thursday 2:45 PM, pp. 11155-11156.

Qiu, B.C. et al., "Monlithically Integrated Fabrication of 2×2 and 4×4 Crosspoint Switches Using Quantum Well Intermixing," Indium Phosphide and Related Materials, Conference Proceedings, Williamsburg, VA (May, 2000), pp. 415-418.

Scheuer, J. et al., "Nonlinear On-Switching of High Spatial Frequency Patterns in Ring Vertical Cavity Surface Emitting Lasers," LEOS '99, San Francisco, CA (Nov. 1999), vol. 1, pp. 123-124.

Soto, H. et al., "All-Optical Switch Demonstration Using a Birefringence Effect In A Semiconductor Optical Amplifier," *CLEO Pacific Rim '99,* pp. 888-889.

Soulage, G. et al,, "Clamped Gain Travelling Wave Semiconductor Optical Amplifier as a Large Dynamic Range Optical Gate," Alcatel Alsthom Recherche, route de Nozay, 91460 Marcoussis, France, undated, 4 unnumbered pages.

Tai, Chien et al., "Dynamic Range and Switching Speed Limitations of an N×N Optical Packet Switch Based on Low-Gain Semiconductor Optical Amplifiers," *Journal of Lightwave Technology,* vol. 14, No. 4 (Apr. 1996), pp. 525-533.

Tiemeijer, L.F. et al., "High-Gain 1310 nm Semiconductor Optical Amplifier Modules with a Built-in Amplified Signal Monitor for Optical Gain Control," *IEEE Photonics Technology Letters,* vol. 9, No. 3 (Mar. 1997), pp. 309-311.

Tiemeijer, L.F. et al., "Reduced Intermodulation Distrotion in 1300 nm Gain-Clamped MQW Laser Amplifiers," *IEEE Photonics Technology Letters,* vol. 7, No. 3 (Mar. 1995), pp. 284-286.

Toptchiyski, Guerogui et al., "Time-Domain Modeling of Semiconductor Optical Amplifiers for OTDM Applications," *Journal of Lightwave Technology,* vol. 17, No. 12 (Dec. 1999), pp. 2577-2583.

van Roijen, R. et al., "Over 15 dB Gain From A Monolithically Integrated Optical Switch With An Amplifier," *IEEE Photonics Technology Letters,* vol. 5, No. 5 (May 1993), pp. 529-531.

Yoshimoto, N. et al., "Spot-Size Converted Polarization-Insensitive SOA Gate With A Vertical Tapered Submicrometer Strip Structure," *IEEE Photonics Technology Letters,* vol. 10, No. 4 (Apr. 1998), pp. 510-512.

* cited by examiner

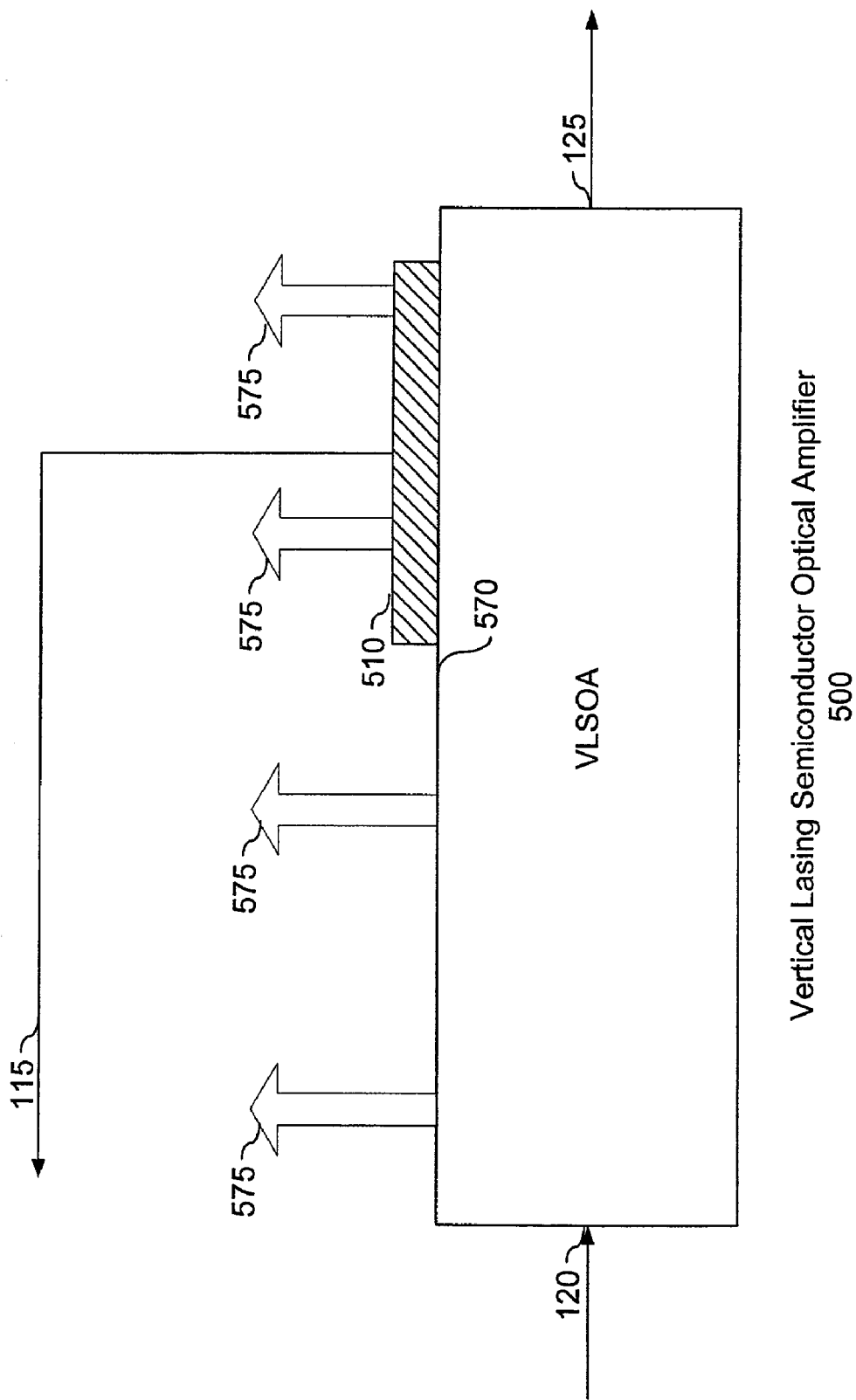

Optical Routing Node 170

Optical Routing Node 170

Optical Combiner 151

Optical NAND Gate 700

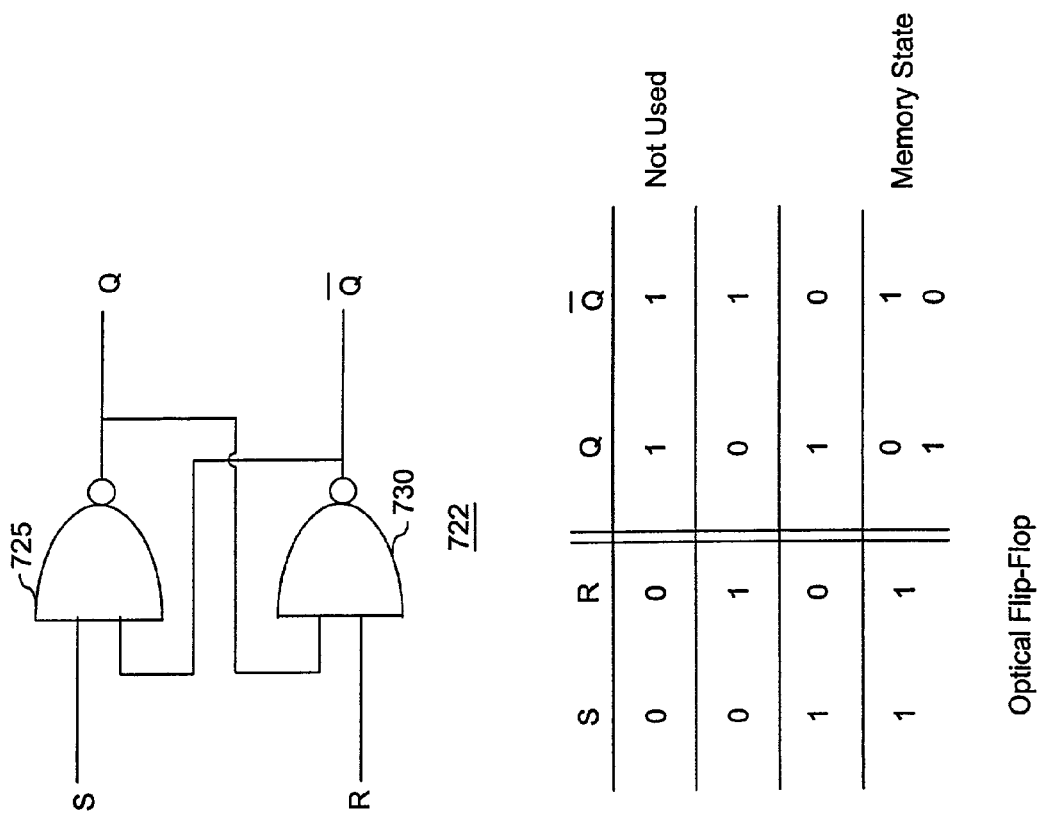

Optical Buffer Element

| Control | D1M | Q1M | Q1S | Q2M | Q2S |
|---|---|---|---|---|---|
| 1 | B1 | B1 | B1 | | |
| 0 | | B1 | B1 | | |
| 1 | B2 | B2 | B2 | B1 | |
| 0 | | B2 | B2 | B1 | B1 |

Buffer Array

OPTICAL CROSSBAR USING LASING SEMICONDUCTOR OPTICAL AMPLIFIERS

CROSS-REFERENCE TO RELATED APPLICATIONS

This application is a continuation-in-part of U.S. patent application Ser. No. 09/809,812, "Vertical Lasing Semiconductor Optical Amplifier (VLSOA) Packet Router," by Sol. P Dijaili, Jeffrey D. Walker and Frank G. Patterson, filed Mar. 16, 2001; and claims priority from provisional U.S. Patent Application Ser. No. 60/255,753, "Optical Devices Including A Semiconductor Optical Amplifier," by Jeffrey D. Walker, Sol P. DiJaili, John M. Wachsman, Frank G. Paterson, and James A Witham, filed Dec. 14, 2000, and provisional U.S. Patent Application Ser. No. 60/274,471, "Optical Crossbar Switch," by Sol P. DiJaili and Jeffrey D. Walker, filed Mar. 9, 2001. The subject matter of all the foregoing is incorporated herein by reference.

BACKGROUND

A. Technical Field

The present invention relates generally to an optical crossbar switch that may be used in an optical network and, more particularly, to an optical crossbar switch that implements various characteristics of lasing semiconductor optical amplifiers in order to reduce the number of electrical components within the switch and enhance the conversion between optical and electrical signals within the switch. The lasing SOA may be used to build monolithically integrated digital optical circuit much in the same manner that electrical transistors are used to make monolithically integrated digital electronic circuits.

B. Background of the Invention

The proliferation of the Internet and corresponding high bandwidth network applications is well known. Within the networking software arena, there is a continuous demand on software developers to provide a higher quality product. In response, network software providers are spending large amounts of money in research and development to increase the quality and functionality of their software products that run on a network. However, this increase in quality and functionality places a demand on existing networks to provide sufficient bandwidth so these quality levels are maintained. For example, Internet software that allows for real-time delivery of multimedia files, webcasts, voice over IP, and interactive Internet video gaming have all recently appeared. These software applications have many advantages over older software versions including high-resolution imaging, dynamic user interaction and real-time rich content data streaming. These new software applications require a large amount of network bandwidth to function properly. As a result, service providers are constantly trying to improve the performance and increase the amount of available bandwidth on their networks.

Typically, service providers can increase a network's bandwidth using one of two methods. First, network bandwidth may be increased by physically expanding the network or by increasing the number of channels contained within the network. Second, network bandwidth may be increased by optimizing the utilization of the current network. Examples of how a network may be optimized include implementing load balancing techniques, richer protocols, or more efficient routing schemes. However, network utilization can only increase performance so much before a ceiling is hit at which the network utilization is maximized. Comparatively, physically increasing or building out a network usually is only limited to the actual physical expansion of the network (i.e. increase in fiber, switches, etc.) or the number of new channels placed within the network. For example, recent advancements in DWDM have allowed service providers to drastically increase the number of channels that may be implemented within an optical network.

Service providers may also increase bandwidth by increasing the rate at which data travels across the network. Typically, this rate is calculated from insertion of data into the network to arrival of the data at a corresponding destination. As a result, this rate is an average speed from network input to output.

Generally, the time constraints of routing data within a network switch account for the majority of time required for data to travel across a network. Data is typically switched within an optical network by converting the data from an optical signal to an electrical signal, storing the data electrically within the switch, processing routing data contained in the data signal, and finally retrieving and routing the stored data according to the processed routing data. The time required to perform these electrical processes greatly reduces the rate at which data travels across a network, thereby decreasing the network bandwidth. As a result, there is a significant interest in a completely optical network switch or, in the alternative, ways in which the electrical components within the switch can be reduced. Decreasing the delay caused by electrical network components increases the speed at which the data will travel across the network resulting in an increase in bandwidth available on a network. Thus, there is a need to provide an optical switching fabric containing a reduced number of electrical components. This reduction will likely increase the speed of the optical switching fabric and lower the cost due to the decrease in actual components.

SUMMARY OF THE INVENTION

The present invention overcomes the deficiencies and limitations of the prior art by providing an optical crossbar switch having a minimal number of electrical components, thereby increasing the speed through which data may be switched within the optical crossbar. In particular, the present invention utilizes various characteristics of a lasing semiconductor optical amplifier (SOA) within the optical crossbar switch to reduce the number of electrical components and enhance conversions between electrical and optical signals.

According to an embodiment, the optical crossbar switch comprises an optical crossbar, a plurality of buffers, a plurality of lasing SOAs, a plurality of optical signal reshaping devices such as a Schmitt trigger, and a processor. The optical crossbar includes a plurality of inputs and outputs coupled to each other by optical routing nodes within the optical crossbar. Each input is coupled to a buffer and a lasing SOA. An optical signal enters a lasing SOA and is amplified as it propagates through the lasing SOA. In response to this amplification, the lasing SOA emits a ballast laser signal representative of data within the optical signal through a ballast laser signal-emitting surface.

A detector coupled to the ballast laser signal-emitting surface converts the ballast laser signal to an electrical signal. The electrical signal, that is approximately a replica of the digital bit stream being sent through the lasing SOA, is reshaped by the optical shaping device (e.g., Schmitt trigger) and the digital header information is transmitted to the processor. An analog-to-digital converter may be used in place of the optical shaping device, but would be optional at best, because the electrical signal contains the address information in a binary digital format. The ballast laser transmission is an analog process; however, the levels on the optical signal are still digital in nature and thus a signal conditioner like a Schmitt trigger can be used to restore and/or reshape the electrical signal with digital information. The electrical signal is shaped into a more defined digital electrical signal by the reshaping device and/or the A/D converter and transmitted to the processor. The processor analyzes the digital electrical signal to identify routing information relating to the optical signal that was amplified by the lasing SOA. This routing information is processed and an appropriate output on the optical crossbar is determined for the optical signal based on this routing information. The processor creates a path through the optical crossbar from the lasing SOA to the appropriate output on the optical crossbar. This path is created by activating at least one optical routing node within the optical crossbar so that the path is open; thereby, allowing the optical signal to reach the appropriate output. It is important to note that there are multiple methods in which a path between an input and an output on the optical crossbar may be created.

In one embodiment, the optical routing node comprises an optical splitting device and an optical amplifier. The optical splitting device diverts a portion of the optical signal from a first path to a second path leading to a particular output on the optical crossbar. The optical amplifier amplifies the diverted portion of the optical signal. In one embodiment, a power coupler is used to divert a portion of the optical signal onto a second path. In another embodiment, an optical demultiplexer is used to drop a channel or group of channels onto the second path. The diverted/dropped optical signal is then amplified by the optical amplifier, sent to a combiner and transmitted from a corresponding output.

BRIEF DESCRIPTION OF THE DRAWINGS

The teachings of the present invention can be readily understood by considering the following detailed description in conjunction with the accompanying drawings. The drawings are not necessarily done to scale.

FIG. 5 is a block diagram of a VLSOA and corresponding ballast laser light detector.

FIG. 7B is a block diagram of an optical flip-flop according to the present invention.

DETAILED DESCRIPTION OF THE EMBODIMENTS

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

A. Optical Crossbar Switch Overview

Figure 1:
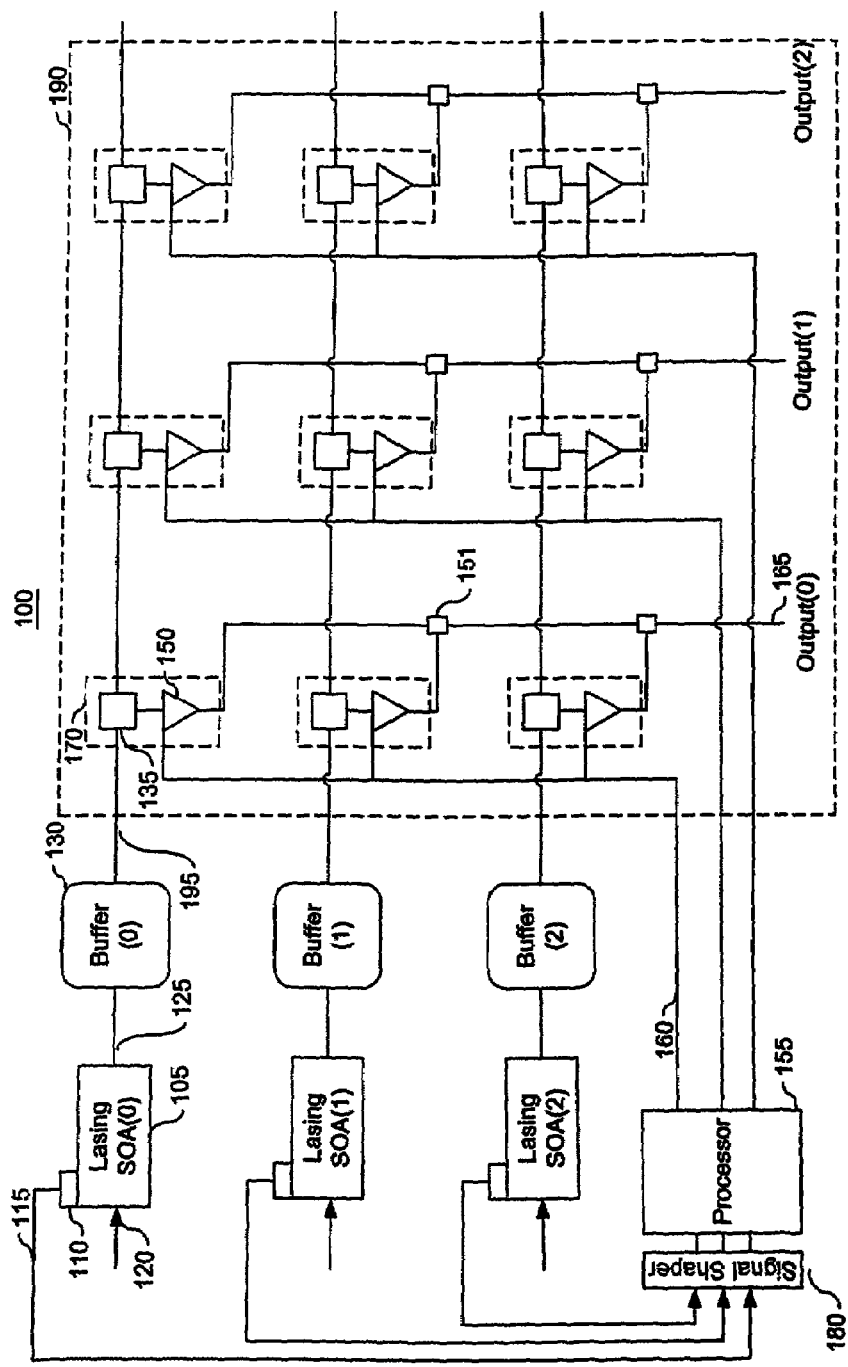
FIG. 1 is a block diagram of an optical crossbar switch according to one embodiment of the present invention.

FIG. 1 is a block diagram of an optical crossbar switch 100 that reduces the number of electrical components. This switch 100 comprises lasing SOAs 105, monitor circuits 110, a processor 155, buffers 130, and an optical crossbar 190. The optical crossbar 190 includes a plurality of optical nodes 170 that route optical signals from an input 195 on the crossbar 190 to a corresponding output.

In one embodiment of the present invention, a lasing SOA 105 is coupled to an input 195 on the optical crossbar 190. The lasing SOA 105 comprises an input 120 that receives an optical signal. The lasing SOA 105 amplifies this optical signal and outputs two signals. First, the amplified optical signal is transmitted from the lasing SOA 105 via output 125. Second, a ballast laser signal is generated as part of the amplification process that occurs within the lasing SOA 105. This ballast laser signal correlates to the optical signal that is being amplified. This ballast laser signal is emitted from a ballast laser signal-emitting surface on the lasing SOA 105. In this embodiment, a monitor circuit 115 is positioned in close proximity to the emitting surface to detect the ballast laser signal. The actual location of the emitting surface depends on the type of lasing SOA used. For example, a vertical lasing SOA (VLSOA) emits a ballast laser signal from either the top or bottom surfaces of the VLSOA. Comparatively, a longitudinal lasing SOA or transverse lasing SOA may emit the ballast laser signal from a different surface on the particular lasing SOA.

The monitor circuit 115 typically includes a detector that converts an optical signal to an electrical signal. According to this embodiment, the detector converts the ballast laser signal to an electrical signal representative of the ballast laser emitted from the surface on the lasing SOA. The intensity of the ballast laser signal relates to the power level of the amplified optical signal as it travels through the lasing SOA. Thus, the data within the amplified optical signal may be recovered from the electrical signal created by this conversion process. The electrical signal may be transmitted from the detector via line 115 to a signal-reshaping device 180, such as a Schmitt trigger, to better define the digital data within the electrical signal. An analog-to digital converter (not shown) may also be used either as a substitute for the optical shaping device 180 or as a complement to the optical shaping device 180. However, the use of the converter or the optical shaping device may not be required depending on the clarity of the electrical signal. According to this embodiment, the electrical signal containing digital information including routing information is sent to a processor 155.

The processor 155 analyzes the electrical signal so that routing data may be identified. This routing data may include information such as a destination address, a source address or a content-type identifier for the optical signal. The processor 155 analyzes this routing data in order to determine an appropriate output 165 on the optical crossbar. Once an output 165 is identified, a path is created from the lasing SOA 105 to the appropriate output 165. This path is created by activating a particular optical node 170 within the optical crossbar. In this embodiment, this activated optical node 170 opens a path between the input 120 and the output 165 as well as providing an amplifier 150 within the optical node to ensure that the signal is sufficiently strong at the output 165.

In particular, the processor 155 activates the optical node 170 via line 160. This activation process includes setting a sufficiently high gain across the amplifier 150 in the optical node 170. If the optical node 170 is not activated, then the amplifier blocks the path preventing an optical signal from reaching the output 165 from the input 195. The optical node also includes an optical splitting device 135 that either diverts a portion of the optical signal or drops a particular channel or group of channels. A power coupler may be used to divert a portion of the optical signal or an optical demultiplexer may be used to drop a channel or group of channels. Additionally, a combiner 151 is used to insert a signal onto an output line. For example, a multiplexer may be used to insert a particular dropped channel onto a output line 165.

During the time required by the processor to analyze the electrical signal and create a path through the optical crossbar, the optical signal is stored within a buffer 130. Various types of buffers may be used including optical and electrical buffers. If an electrical buffer is used, then the optical signal is converted to an electrical signal prior to storage. As described above, the time required to convert the optical signal to an electrical signal and then convert it back to an optical signal creates a time delay within the optical crossbar switch. However, an optical buffer may also be used to avoid this conversion requirement. As a result, the time required to route an optical signal through the optical crossbar is reduced. After the path is created, the buffer 130 transmits the stored signal optically so that it may propagate to the appropriate output 165.

Each of the components of this optical crossbar switch embodiment is described in greater detail below.

a) Lasing Semiconductor Optical Amplifier

Figure 2:
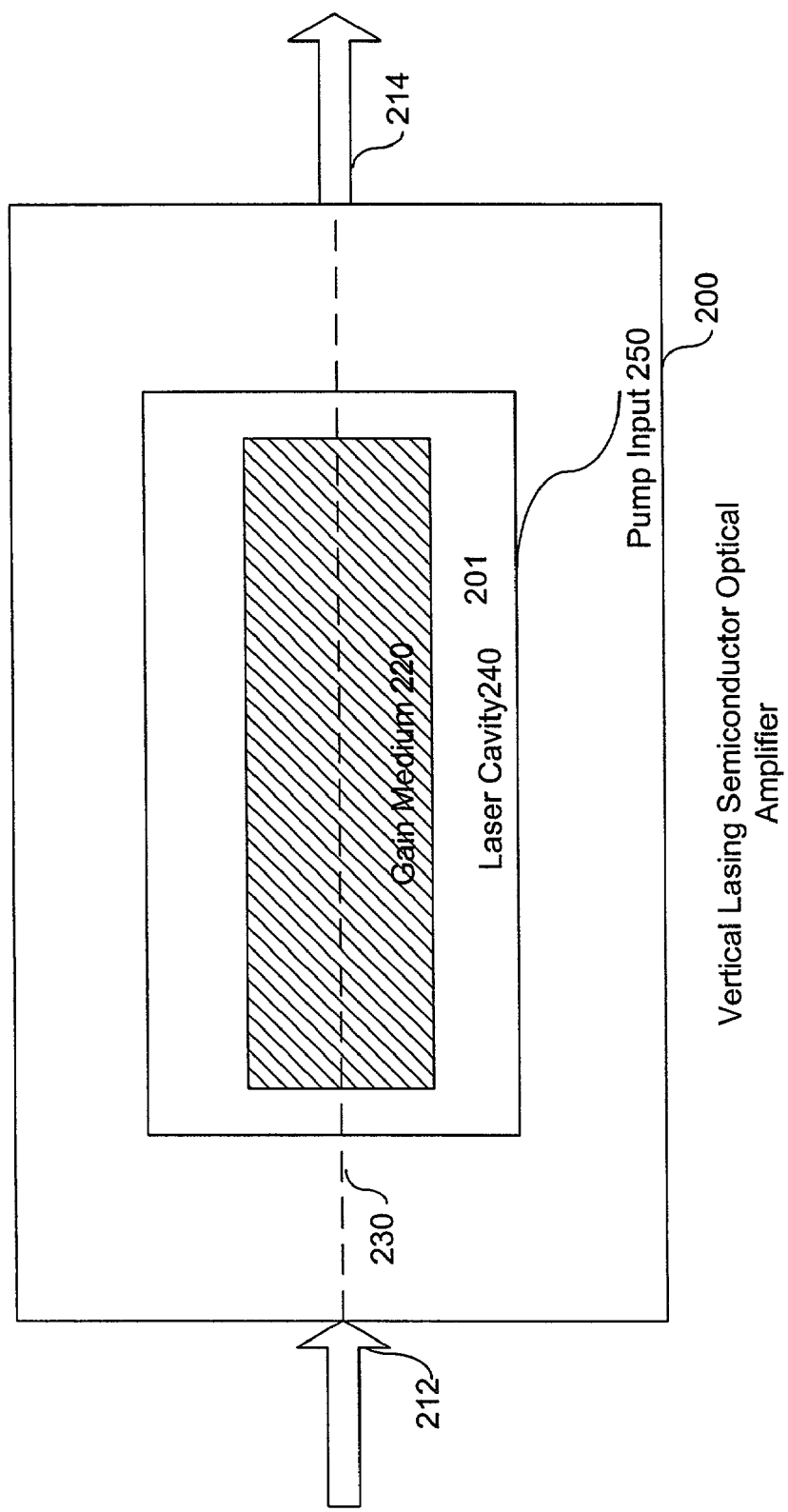
FIG. 2 is a diagram of a vertical lasing semiconductor optical amplifier (VLSOA)

For purposes of illustration, a particular embodiment of the lasing SOA, the vertical lasing SOA ("VLSOA") will be described in detail. FIG. 2 is a diagram of a VLSOA 200 in accordance with the present invention. The VLSOA 200 has an input 212 and an output 214. The VLSOA 200 further includes a semiconductor gain medium 220, with an amplifying path 230 coupled between the input 212 and the output 214 of the VLSOA 200 and traveling through the semiconductor gain medium 220. The VLSOA 200 further includes a laser cavity 240 including the semiconductor gain medium 220, and a pump input 250 coupled to the semiconductor gain medium 220. The laser cavity 240 is oriented vertically with respect to the amplifying path 230. The pump input 250 is for receiving a pump to pump the semiconductor gain medium 220 above a lasing threshold for the laser cavity 240.

Figure 3:
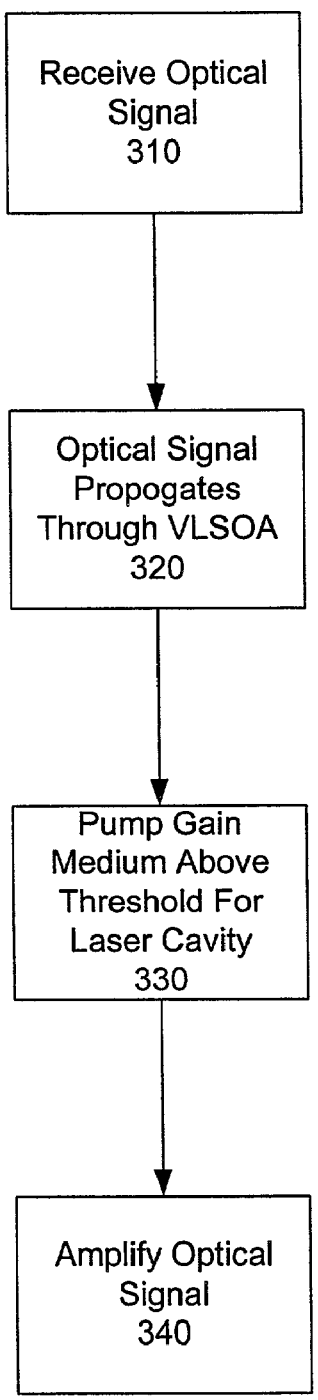
FIG. 3 is a flowchart showing the operation of a VLSOA used as an amplifier.

FIG. 3 is a flow diagram illustrating operation of VLSOA 200 when it is used as an amplifier. The VLSOA 200 receives 310 an optical signal at its input 212. The optical signal propagates 320 along the amplifying path 230. The pump received at pump input 250 pumps 330 the semiconductor gain medium above a lasing threshold for the laser cavity 240. When lasing occurs, the round-trip gain offsets the round-trip losses for the laser cavity 240. In other words, the gain of the semiconductor gain medium 220 is clamped to the gain value necessary to offset the round-trip losses. The optical signal is amplified 340 according to this gain value as it propagates along the amplifying path 230 (i.e., through the semiconductor gain medium 220). The amplified signal exits the VLSOA 200 via the output 214.

Note that the gain experienced by the optical signal as it propagates through the VLSOA 200 is determined in part by the gain value of the semiconductor gain medium 220 (it is also determined, for example, by the length of the amplifying path 230) and this gain value, in turn, is determined primarily by the lasing threshold for the laser cavity 240. In particular, the gain experienced by the optical signal as it propagates through each VLSOA 200 is substantially independent of the amplitude of the optical signal. This is in direct contrast to the situation with non-lasing SOAs and overcomes the distortion and cross-talk disadvantages typical of non-lasing SOAs.

Figure 4A:
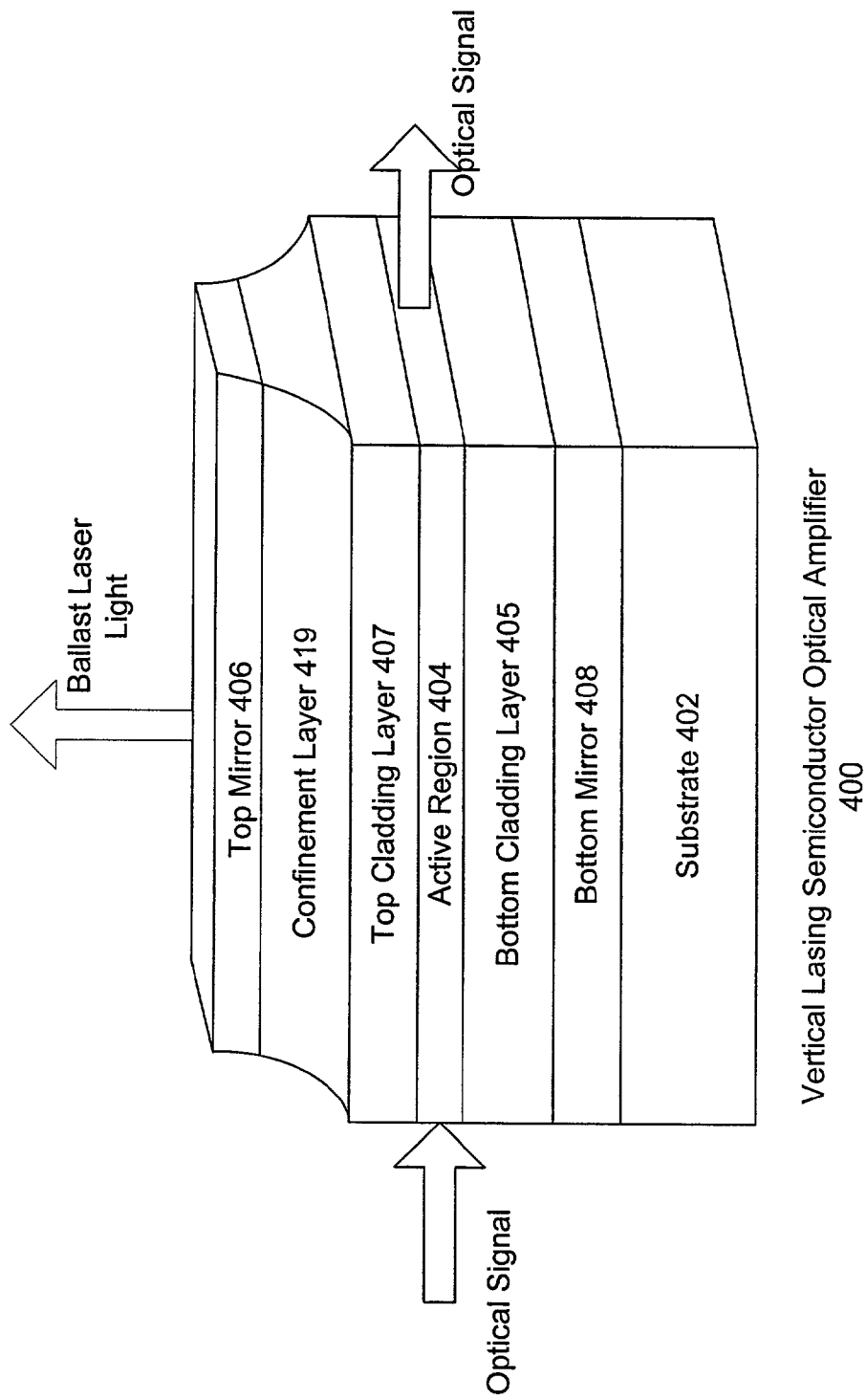
FIG. 4A is a perspective view of one embodiment of a VLSOA.
Figure 4B:
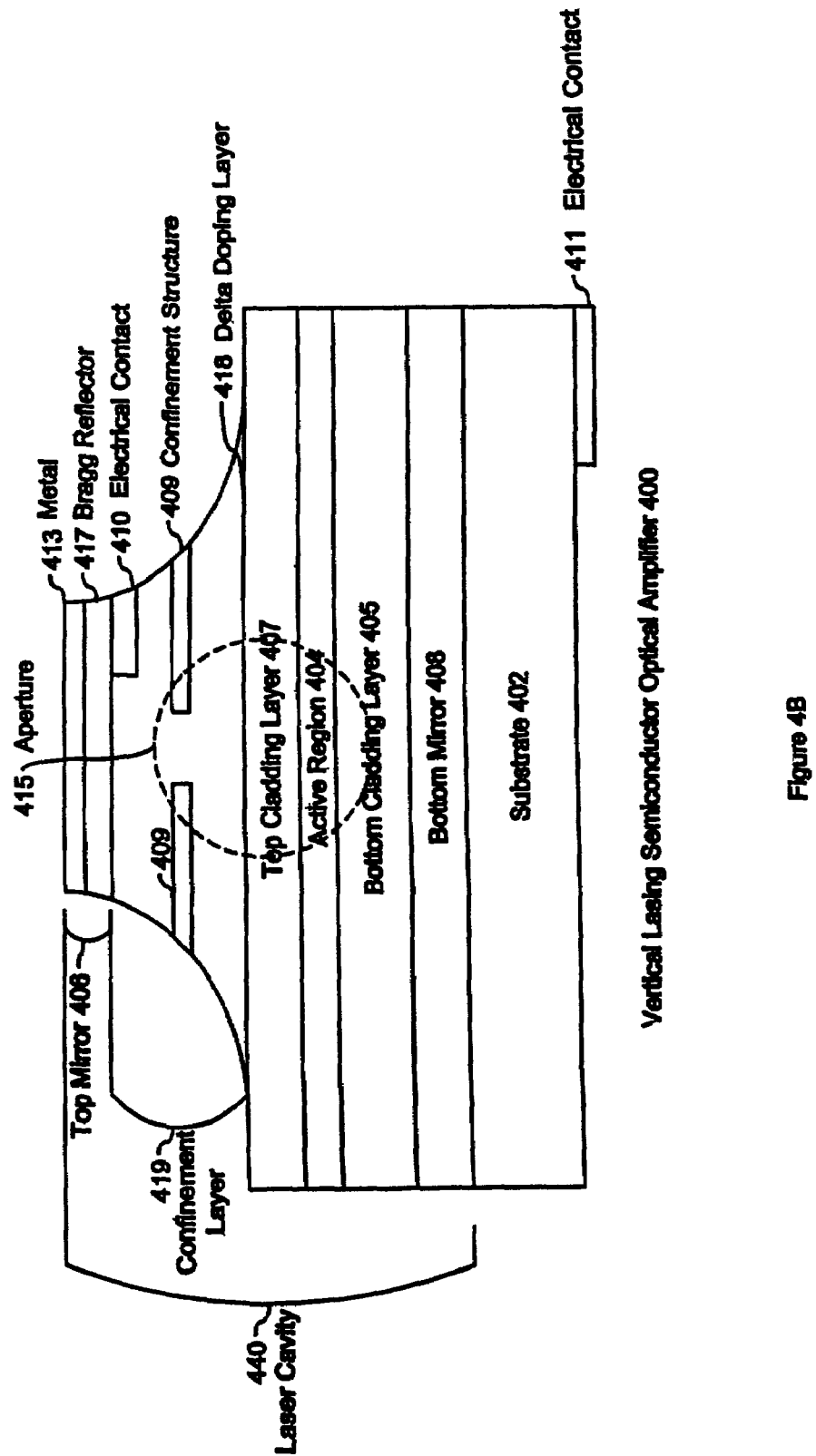
FIG. 4B is a detailed transverse cross-sectional view of one embodiment of a VLSOA.
Figure 4C:
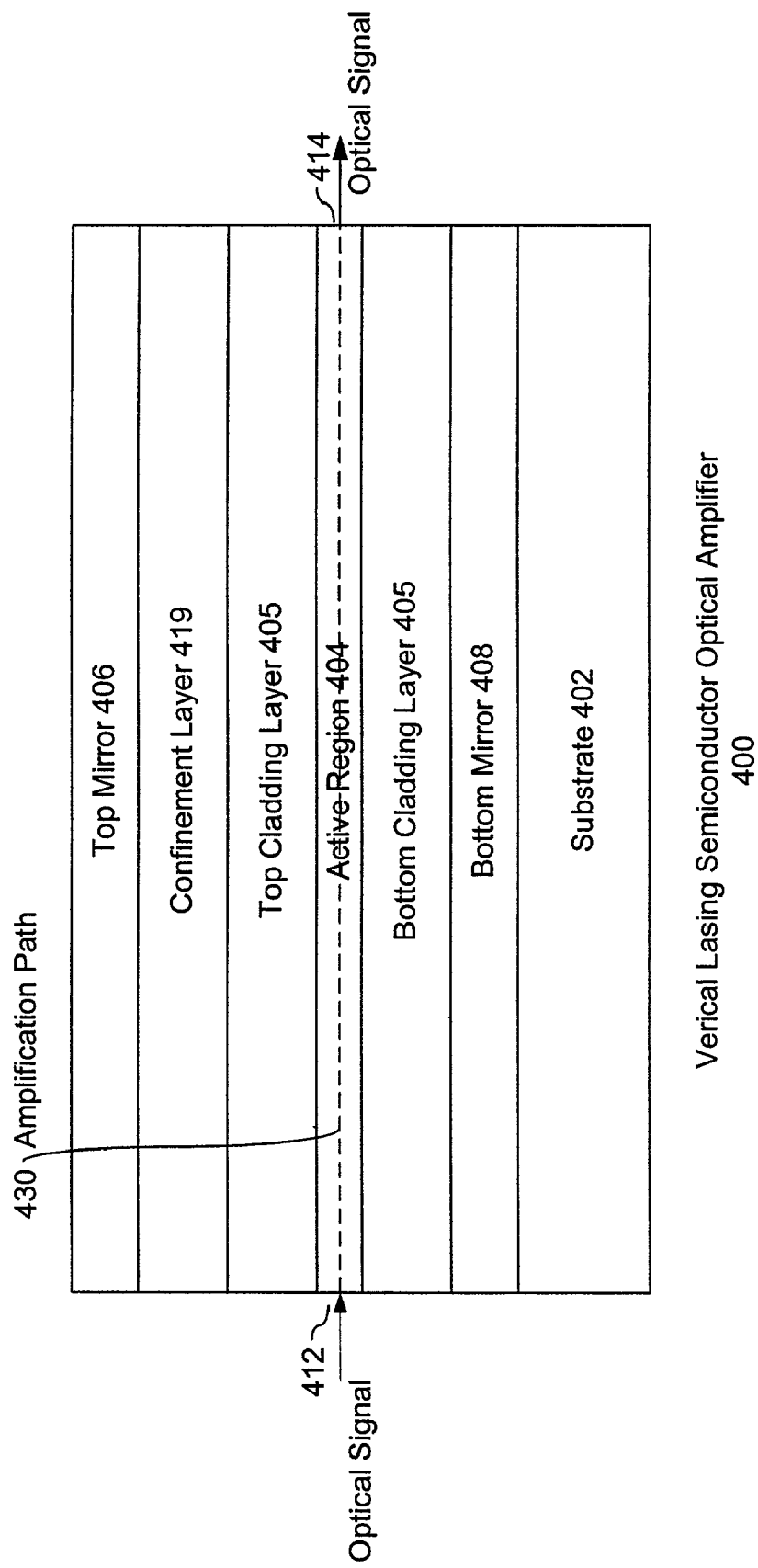
FIG. 4C is a longitudinal cross-sectional view of one embodiment of a VLSOA.

FIGS. 4A–4C are a perspective view, transverse cross-section, and longitudinal cross-section, respectively, of one embodiment of a VLSOA 400 according to the present invention, with FIG. 4B showing the most detail.

Referring to FIG. 4B and working from bottom to top in the vertical direction (i.e., working away from the substrate 402), VLSOA 400 includes a bottom mirror 408, bottom cladding layer 405, active region 404, top cladding layer 407, confinement layer 419, and a top mirror 406. The bottom cladding layer 405, active region 404, top cladding layer 407, and confinement layer 419 are in electrical contact with each other and may be in direct physical contact as well. An optional delta doping layer 418 is located between the top cladding layer 407 and confinement layer 419. The confinement layer 419 includes a confinement structure 409, which forms aperture 415. The VLSOA 400 also includes an electrical contact 410 located above the confinement structure 409, and a second electrical contact 411 formed on the bottom side of substrate 402.

Comparing to FIG. 2, the semiconductor gain medium 220 includes the active region 404 and the laser cavity 240 is formed primarily by the two mirrors 406 and 408 and the active region 404. This embodiment is electrically pumped so the pump input 250 includes the electrical contacts 410,411.

VLSOA 400 is a vertical lasing semiconductor optical amplifier since the laser cavity 440 is a vertical laser cavity. That is, it is oriented vertically with respect to the amplifying path 430 and substrate 402. The VLSOA 400 preferably is long in the longitudinal direction, allowing for a long amplifying path 430 and, therefore, more amplification. The entire VLSOA 400 is an integral structure formed on a single substrate 402 and may be integrated with other optical elements. In most cases, optical elements which are coupled directly to VLSOA 400 will be coupled to the amplifying path 430 within the VLSOA. Depending on the manner of integration, the optical input 412 and output 414 may not exist as a distinct structure or facet but may simply be the boundary between the VLSOA 400 and other optical elements. Furthermore, although this disclosure discusses the VLSOA 400 primarily as a single device, the teachings herein apply equally to arrays of devices.

VLSOA 400 extends primarily in the vertical direction, allowing the VLSOA 400 to be fabricated using standard semiconductor fabrication techniques, preferably including organo-metallic vapor phase epitaxy (OMVPE) or organo-metallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

In more detail, in this embodiment, the substrate 402 is n-doped InP (n-InP), the bottom cladding layer 405 is n-InP, the top cladding layer 407 is p-doped InP (p-InP), and the confinement layer 419 is p-GaAs/AlGaAs. The switch from p-InP in top cladding layer 407 to p-GaAs in confinement layer 419 facilitates the construction of features such as the confinement structure 409 and top mirror 406. GaAs, however, is not lattice-matched to InP, resulting in unwanted electrical effects. The delta doping layer 418, which in this embodiment is a p-type Beryllium (p-Be) doping, counteracts these unwanted electrical effects.

The optical signal amplified by the VLSOA 400 is confined in the vertical direction by index differences between bottom cladding 405, active region 404, and top cladding 407, and to a lesser extent by index differences between the substrate 402, bottom mirror 408, confinement layer 419, and top mirror 406. Specifically, active region 404 has the higher index and therefore acts as a waveguide core with respect to cladding layers 405,407. The optical signal is confined in the transverse direction by index differences between the confinement structure 409 and the resulting aperture 415. Specifically, aperture 415 has a higher index of refraction than confinement structure 409. As a result, the mode of the optical signal to be amplified is generally concentrated in dashed region 421. The amplifying path 430 is through the active region 404 in the direction in/out of the plane of the paper with respect to FIG. 4B.

The active region 404 in embodiment 400 includes a double heterostructure (DH) of p-InAlAs/I-InAlGaAs/n-InAlAs. In other embodiments, the active region 404 may comprise a multiple quantum well (MQW) active region. MQW structures include several quantum wells and quantum wells have the advantage of enabling the formation of lasers with relatively low threshold currents. Further improvements in the threshold current may be obtained with quantum dot active regions. Double heterostructures, quantum wells and quantum dots may be fabricated using various materials systems, including for example InAlGaAs on InP substrates, InGaAsP on InP, GaInNAs on GaAs, InGaAs on ternary substrates, and GaAsSb on GaAs. An embodiment uses InAlGaAs grown on an h P substrate. GaAs, InGaAs, or InAlGaAs on GaAs; or nitride material systems may also be suitable. Alternatively, the active region 404 may comprise a single quantum well.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In an embodiment, the VLSOA 400 is optimized for the 1.55 micron window.

In one embodiment, the active region 404 includes a multiple quantum well (MQW) active region. MQW structures include several quantum wells and quantum wells have the advantage of enabling the formation of lasers with relatively low threshold currents. In alternate embodiments, the active region 404 may instead be based on a single quantum well or a double-heterostructure active region. The active region 404 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 405 and 407 will depend in part on the composition of active region 404.

Examples of top and bottom mirrors 406 and 408 include Bragg reflectors and non-Bragg reflectors such as metallic mirrors. Bottom mirror 408 in FIG. 4 is shown as a Bragg reflector. Top mirror 406 is depicted as a hybrid mirror, consisting of a Bragg reflector 417 followed by a metallic mirror 413. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 410 and 411 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 410 and 411 into the active region 404. In particular, contact 410 is a p-type contact to inject holes into active region 404, and contact 411 is an n-type contact to inject electrons into active region 404. Contact 410 is located above the semiconductor structure (i.e., above confinement layer 419 and the semiconductor part of Bragg reflector 417, if any) and below the dielectric part of Bragg reflector 417, if any. For simplicity, in FIG. 4, contact 410 is shown located between the confinement layer 419 and Bragg reflector 417, which would be the case if Bragg reflector 417 were entirely dielectric. VLSOA 400 may have a number of isolated electrical contacts 410 to allow for independent pumping within the amplifier. This is advantageous because VLSOA 400 is long in the longitudinal direction and independent pumping allows, for example, different voltages to be maintained at different points along the VLSOA. Alternately, the contacts 410 may be doped to have a finite resistance or may be separated by finite resistances, rather than electrically isolated.

Confinement structure 409 is formed by wet oxidizing the confinement layer 419. The confinement structure 409 has a lower index of refraction than aperture 415. Hence, the effective cross-sectional size of laser cavity 440 is determined in part by aperture 415. In other words, the confinement structure 409 provides lateral confinement of the optical mode of laser cavity 440. In this embodiment, the confinement structure 409 also has a lower conductivity than aperture 415. Thus, pump current injected through electrical contact 410 will be channeled through aperture 415, increasing the spatial overlap with optical signal 421. In other words, the confinement structure 409 also provides electrical confinement of the pump current.

The integration of VLSOAs with other optical elements may be implemented using any number of techniques. In one approach, both the VLSOA and the other optical element are formed using a common fabrication process on a common substrate, but with at least one parameter varying between the VLSOA and the optical element. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface. This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first substrate. The optical element is formed on a second substrate. The VLSOA and the optical element are then integrated onto a common substrate, which could be the first substrate, the second substrate or a completely different substrate.

In an embodiment 400, bottom mirror 408 is a Bragg reflector formed by either alternating layers of InAlGaAs and InAlAs, alternating layers of InGaAsP and InP, alternating layers of GaAs and AlGaAs, or alternating layers of AlGaAsSb and AlAsSb. Top mirror 406 is a hybrid mirror, which combines a number of layers of a Bragg reflector 417 (specifically, alternating layers of GaAs and AlGaAs, and/or alternating layers of Si and $SiO_2$) followed by a metallic mirror 413 (specifically, gold). The mirrors 406 and 408 may comprise other types of Bragg reflectors or other types of non-Bragg mirrors. They typically will have reflectivies in the range of approximately 95–100%. Bragg reflectors are formed by periodic variations of the index of refraction of a medium and can be highly reflective. For example, the Bragg reflector may comprise alternating layers of thicknesses $d_1$ and $d_2$ and refractive indices $n_1$ and $n_2$ such that $n_1 d_1 + n_2 d_2 = \lambda/2$, where $\lambda$ is the wavelength to be reflected. The reflectivity $R = \{[1-(n_1/n_2)^{2N}]/(1+(n_1 n_2)^{2N})\}^2$, where N is the number of periods (pairs) in the Bragg reflector. Reflectivities as high as 99% or more may be achieved. In addition to the ones described above, Bragg reflectors may be fabricated using various materials systems, such as, for example, alternating layers of GaAs and AlAs, or alternating layers of $SiO_2$ and $TiO_2$.

The electrical contacts 410, 411 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 410, 411 into the active region 404. In particular, contact 410 is a p-type contact to inject holes into active region 404, and contact 411 is an n-type contact to inject electrons into active region 404. Contact 410 is located above the semiconductor structure (i.e., above confinement layer 419 and the semiconductor part of Bragg reflector 417, if any) and below the dielectric part of Bragg reflector 417, if any. For simplicity, in FIG. 4, contact 410 is shown located between the confinement layer 419 and Bragg reflector 417, which would be the case if Bragg reflector 417 were entirely dielectric. VLSOA 400 may have a number of isolated electrical contacts 410 to allow for independent pumping within the amplifier. This is advantageous because VLSOA 400 is long in the longitudinal direction and independent pumping allows, for example, different voltages to be maintained at different points along the VLSOA. Alternately, the contacts 410 may be doped to have a finite resistance or may be separated by finite resistances, rather than electrically isolated.

Confinement structure 409 is formed by wet oxidizing the confinement layer 419, which consists of GaAs and AlGaAs. The resulting confinement structure 409 is aluminum oxide and the aperture 415 is the unaltered AlGaAs. The confinement structure 409 has a lower index of refraction than aperture 415. Hence, the effective cross-sectional size of laser cavity 440 is determined in part by aperture 415. In other words, the confinement structure 409 provides lateral confinement of the optical mode of laser cavity 440. In this embodiment, the confinement structure 409 also has a lower conductivity than aperture 415. Thus, pump current injected through electrical contact 410 will be channeled through aperture 415, increasing the spatial overlap with optical signal 421. In other words, the confinement structure 409 also provides electrical confinement of the pump current.

When used as an amplifier, VLSOA 400 operates as follows. Pump current is injected through contacts 410,411, or, more precisely, holes are injected through contact 410 and electrons through contact 411. These holes and electrons flow to the active region 404, where they increase the carrier density in the active region 404. That is, the pump current is used to pump 430 the active region 404. The pump current is laterally confined by aperture 415 and confinement structure 409. The pump current is sufficiently high to exceed a lasing threshold for vertical cavity 440. As a result, laser radiation is generated by the vertical cavity 440. This laser radiation may be emitted from the vertical cavity, for example, through the top surface 420 or into the substrate 402 or it may be generated but not actually emitted from the VLSOA 400. The laser radiation may lie in the visible, infrared, ultraviolet or other frequency range.

While the laser cavity 440 is operating above the lasing threshold, an optical signal is received 410 at input 412 and propagates 220 through the VLSOA 400 along the amplifying path 430. As the optical signal propagates through the active region 404, the optical signal is amplified 340 by a gain multiplier due to stimulated emission of additional photons. The gain multiplier is substantially constant (i.e., independent of the amplitude of the optical signal) because the laser radiation produced by laser cavity 440 acts as a ballast to prevent gain saturation. That is, when the optical signal is weaker, fewer additional photons are stimulated by the optical signal, but more laser radiation is generated. But when the optical signal is stronger, more additional photons are stimulated by the optical signal, but less laser radiation is generated. Typically, the value of the constant gain multiplier is inversely proportional to the loss of the cavity mirrors 406 and 408. For example, ignoring internal loss, if a 0.2% mirror loss (99.8% reflectivity) results in a gain of 10 dB (10 times), then a three times larger 0.6% loss (99.4% reflectivity) would result in a roughly three times larger logarithmic gain of 30 dB (1000 times) for otherwise identical VLSOAs 400. The amplified signal exits the VLSOA 400 at output 414.

b) Monitor Circuit/Optical Detector

FIG. 5 shows an embodiment of a monitor circuit that comprises an optical detector 510 attached to a VLSOA 500. Examples of optical detectors 510 include PIN diodes and Avalanche photodiodes. Specifically, the optical detector 510 is positioned on a ballast laser light-emitting surface 570 of the VLSOA 500. This optical detector converts the ballast laser signal 575 emitted through the emitting surface 570 to electrical analog signals. As described above, this laser light 575 acts as a ballast to prevent gain saturation creating a correlation between the ballast laser light 575 and the strength of an optical signal as it propagates through the VLSOA 500. As a result, the data within the optical signal (represented by high or low signal power levels) may be recovered from the emitted ballast laser light 575.

Referring again to FIG. 1, after the ballast laser light 575 is converted to an equivalent electrical signal, the electrical signal may be shaped in order to more fully define the digital data within the electrical signal. A signal-reshaping device 180 may be used to properly shape digital data within the electrical signal. For example, a Schmitt trigger may be used to more sharply define binary data within the electrical signal. Also, an analog-to-digital converter (not shown) may be used in place of the signal-shaping device 180. However, this converter would likely be used less frequently than a signal-reshaping device such as a Schmitt trigger. The converter may be used to ensure high definition of digital data on the electrical signal. The electrical signal is transmitted to the processor 115 for analysis of routing information (digital data within the signal) so that packet or frame may be properly transmitted through the cross connect 190.

The processor 115 analyzes the electrical signal in order to identify routing information within the optical signal. For example, if routing information is contained within a packet header, the electrical digital signal is analyzed to determine where packet headers are located in the signal. Also, if routing information is contained within a separate channel, then the routing channel is dropped from the optical signal before the monitor circuit 510 converts the optical signal to an electrical signal. Once the routing channel is separated from the optical signal, the optical signal within the routing channel is converted to an electrical digital signal.

After routing information within the electrical signal is identified and analyzed, the processor 115 determines the appropriate output on the optical crossbar corresponding to the optical signal. For example, the destination address of the optical signal, identified within a header, may be used to identify an appropriate next hop within the network. Using this next hop, an output(s) on the optical crossbar is identified corresponding to the next recipient node of the optical signal. The processor 115 creates a path between the optical crossbar input in which the optical signal arrived and the identified appropriate output. The processor 115 creates this path by activating an optical node or nodes within the optical crossbar via lines 160.

c) Optical Routing Node

Figure 6A:
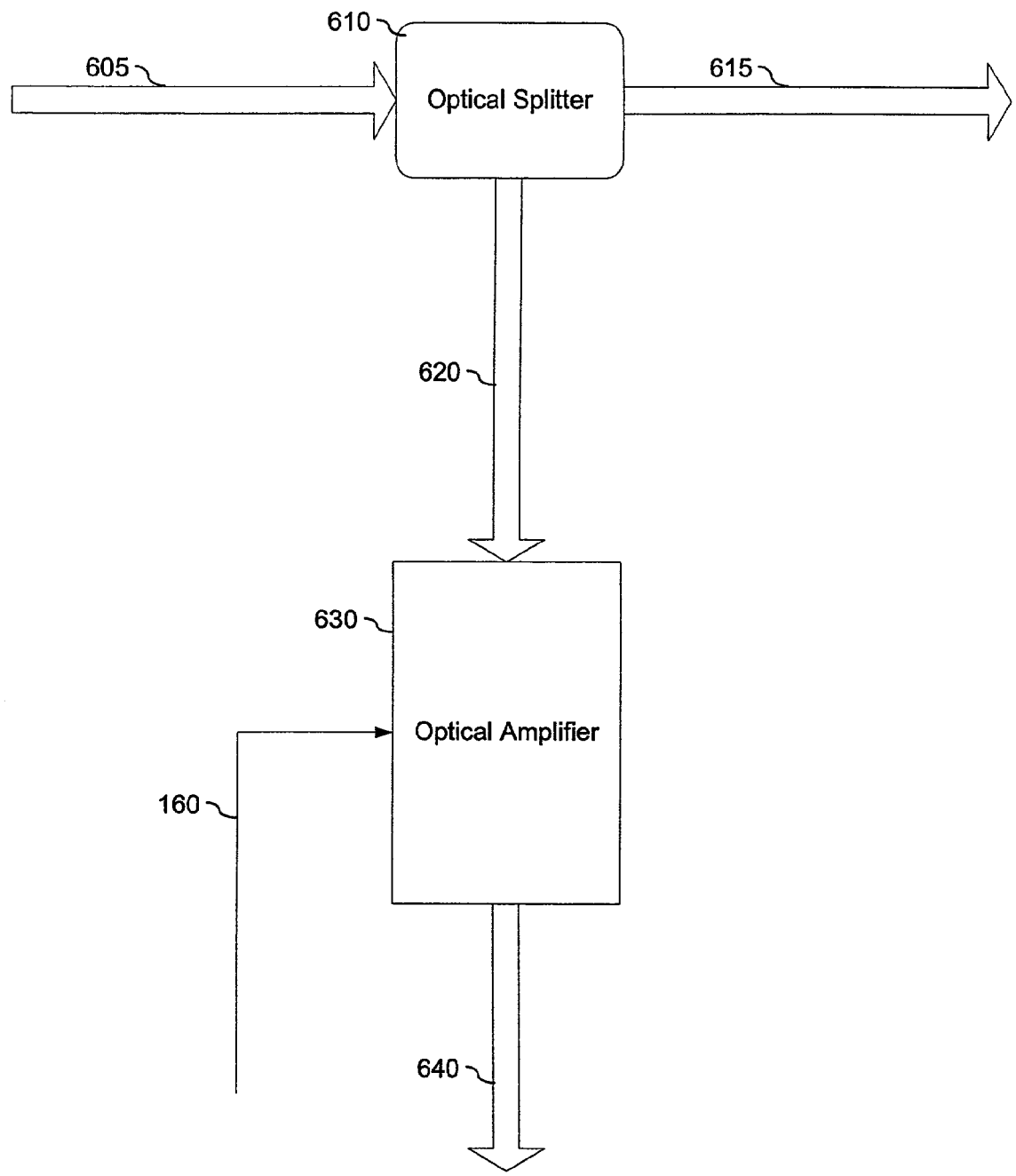
FIG. 6A is a general diagram of a first embodiment of an optical routing node within the optical crossbar.

FIG. 6A is a block diagram of an embodiment of an optical routing node 170 within the optical crossbar. The optical routing node 170 includes an optical splitting device 610 and an optical amplifier 630. The optical splitting device 610 includes an input 605, a first output 615, and a second output 620. The optical amplifier 630 is coupled to the second output 620 of the optical splitting device 610 and is controlled by the processor 155 via line 160.

The optical splitting device 610 receives an optical signal at the input 605 and splits the optical signal between the first output 615 and the second output 620. Examples of optical splitting devices include directional couplers, tap couplers, multi-mode interferometer type couplers, optical demultiplexers or various other types of optical splitters known within the art. A first portion of the optical signal is transmitted from the first output 615 to another optical routing node or terminal node (not shown) within the optical crossbar. A second portion of the optical signal is transmitted from the second output 620 to the optical amplifier 640 within the optical routing node 170. The optical splitting device 610 may adjust the strength of each of the two signal portions by changing its splitting characteristics. For example, the optical splitting device 610 may transmit an optical signal from the first output 615 that is 99 times stronger than the optical signal on the second output 620, in effect, diverting 1 percent of the optical signal.

The optical amplifier 630 receives the second portion of the optical signal from the second output 620 of the optical splitting device 610 and transmits an amplified optical signal to the input of an optical combiner 651 and eventually to an output 165 in the optical crossbar. Examples of optical amplifiers include fiber amplifiers and SOAs of various types. These types of SOAs include conventional SOAs, vertical lasing SOAs, longitudinal lasing SOAs, and transverse lasing SOAs. As described above, the processor 155 controls the optical amplifier 630 via line 160. If the optical amplifier 630 is activated, a gain is applied on the optical signal as it propagates through the optical amplifier 630. However, if the optical amplifier is not activated, the optical signal is blocked and rapidly attenuates as it travels into the optical amplifier 630. As a result, a path is opened to an attached output if the optical amplifier 630 is activated.

Figure 6B:
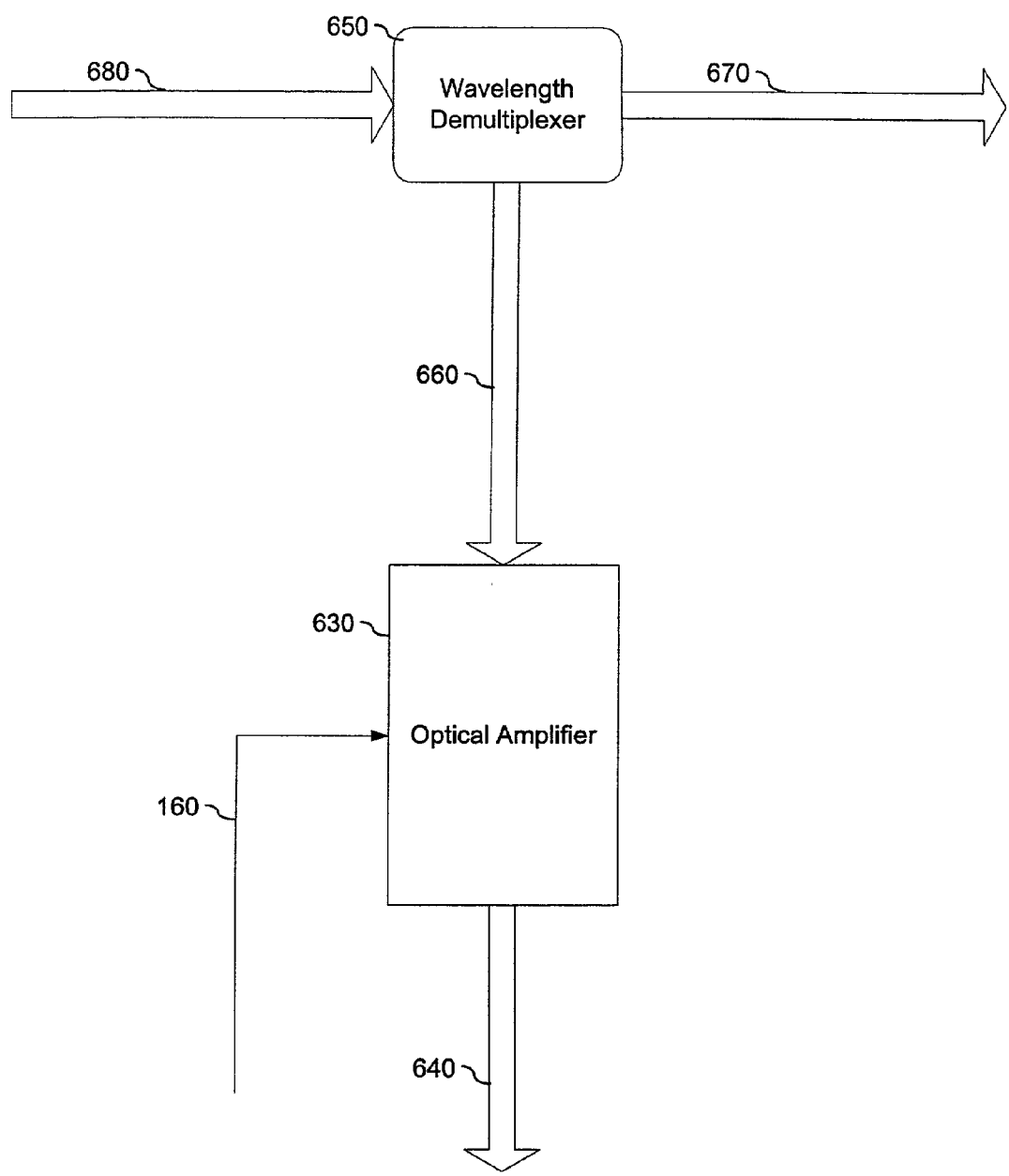
FIG. 6B is a block diagram of a second embodiment of an optical routing node within the optical crossbar.

FIG. 6B is a block diagram of another embodiment of an optical routing node 170 that is wavelength sensitive. The optical routing node 170 comprises a wavelength demultiplexer 650 and an optical amplifier 630. The wavelength demultiplexer 650 includes an input 680, a first output 670, and a second output 660. The optical amplifier 630 is coupled to the second output 660 of the optical demultiplexer 650 and is controlled by the processor 155 via line 160.

The wavelength demultiplexer 650 receives an optical signal containing multiple channels at the input 680 and drops at least one channel (i.e., wavelength or group of wavelengths) onto the second output 660. An example of a wavelength demultiplexer is a grating designed to drop a particular wavelength or group of wavelengths. The dropped channel(s) is transmitted from the second output 660 to the optical amplifier 630 within the optical routing node 170. The remaining channels are transmitted from the first output to another optical routing node or terminal node within the optical crossbar.

The optical amplifier 630 controls the power level of the dropped channel(s). Specifically, the processor 155 may dynamically adjust the gain of the optical amplifier 630 if appropriate optical amplifiers are used. For example, a variable gain lasing SOA or multi-stage optical amplifier may be used so that the gain across the optical amplifier 630 may be controlled by the processor 155. Thereafter, the dropped channel(s) is transmitted to the optical combiner 651 and finally transmitted to an appropriate output on the optical crossbar.

Figure 6C:
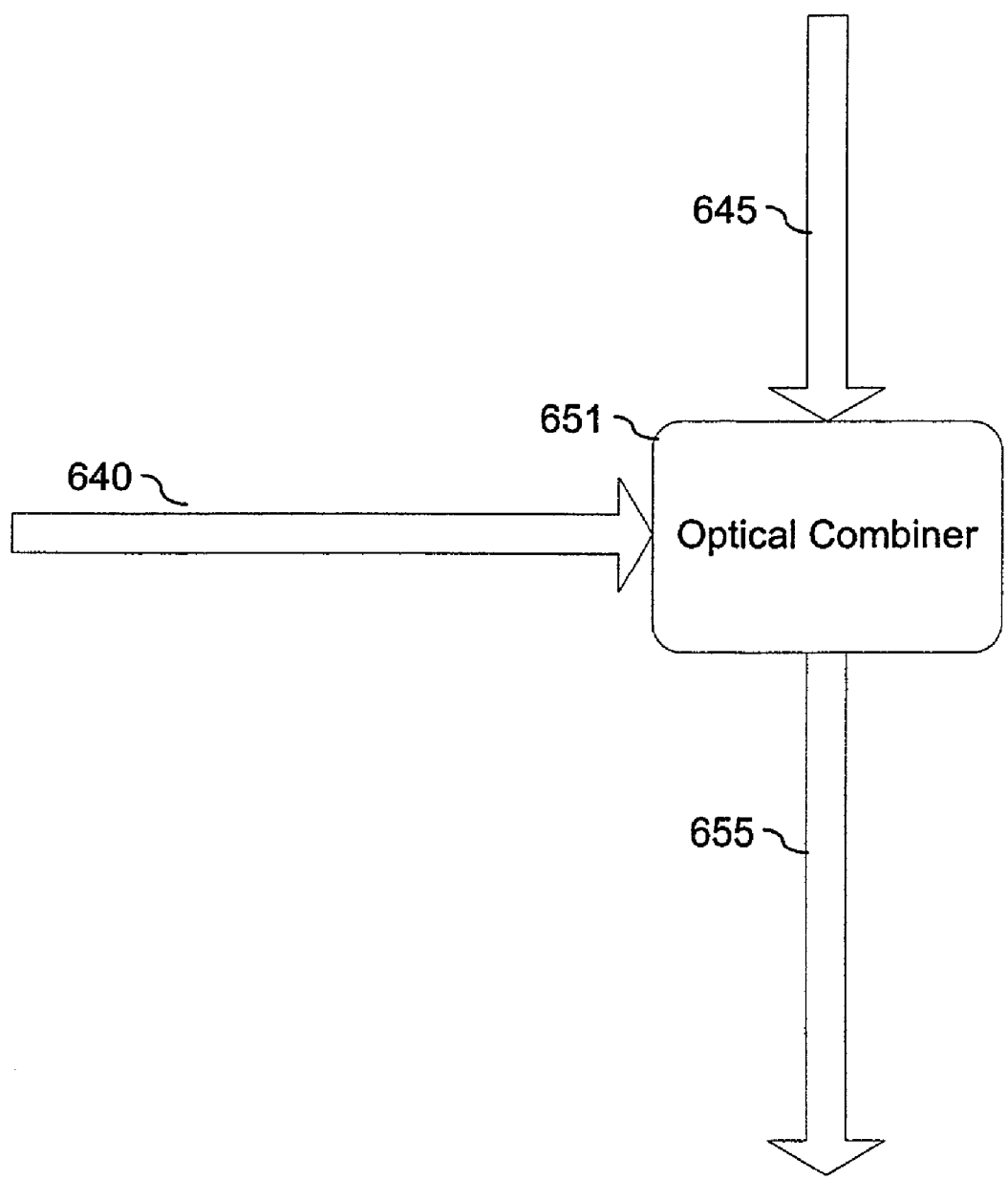
FIG. 6C is a block diagram of an optical combiner used in conjunction with an optical routing node.

FIG. 6C illustrates an embodiment of an optical combiner 651 according to the present invention. The optical combiner 651 has two inputs and a single output. A first input 645 on the optical combiner 651 is coupled to a first optical node transmits an optical signal that has propagated through the first node. A second input 640 on the optical combiner 651 is coupled to a second optical node within the same column as the first optical node and transmits an optical signal that has propagated through the second node. An output 655 on the optical combiner 651 is coupled to an output 165 on the optical crossbar and transmits an optical signal comprising both signals from the inputs 640, 645.

The optical combiner 651 combines the optical signals from the first and second optical nodes into a single optical signal. One method through which this may be done is wave division multiplexing. Accordingly, the combiner 651 in this example would be a wave division multiplexer. However, the signals may also be combined by time division multiplexing, in which case the optical combiner 651 would be a time division multiplexer. The optical combiner 651 may comprise a 3-dB (50%) coupler, a coupler of other than 50%, a polarization combiner, partial reflector, waveguide corner reflector, frustrated total internal reflection, or any other mechanism that causes the signal from inputs 640 and 645 to be partially or fully coupled into the output 655. This multiplexed signal is then transmitted from the optical combiner 651 to an output (e.g., 165) on the optical cross connect via line 655.

The above-described optical nodes are embodiments that may be used to create a path between an input and an output on the optical crossbar. Other methods and systems for creating these paths fall within the scope of the invention and should only be limited by the claims.

Note that the process of identifying and analyzing routing information as well as the process of creating a corresponding path through the optical crossbar require a certain amount of time. As a result, the optical signal should be buffered prior to insertion into the optical crossbar in order to allow the processor 115 to create a path for the optical signal.

d) Buffer

The above described lasing SOA may also be used as an optical transistor analogous to an electrical transistor in forward active mode and thus logical gates (e.g., NAND, NOR, etc.), memory elements (e.g., flip-flops), and linear analog circuit can be built with lasing SOAs in much the same way electronic transistors are used to build monolithic integrated circuits that have both digital and analog functions.

Figure 7A:
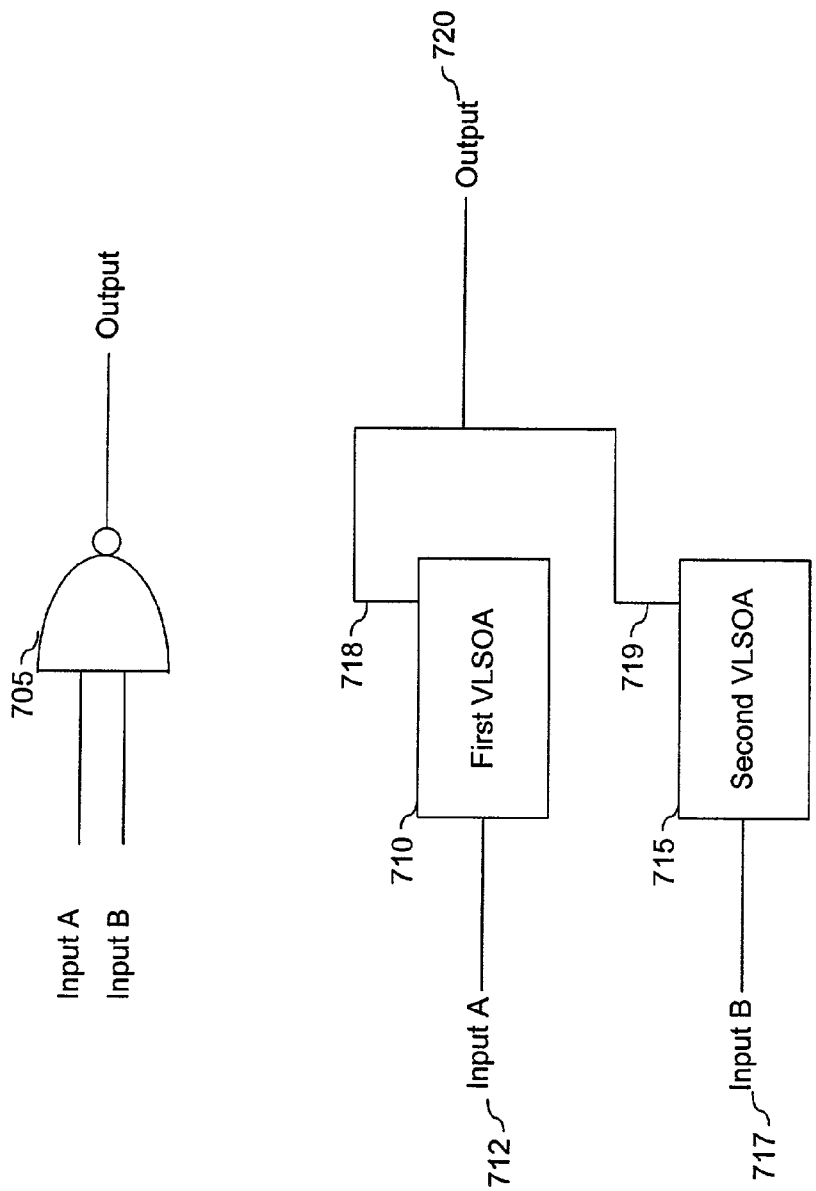
FIG. 7A is a block diagram of an optical NAND gate according to the present invention.

FIG. 7A is an illustration of an embodiment of an optical NAND gate comprising multiple lasing SOAs. In this embodiment, VLSOAs are described; however, other lasing SOAs, such as longitudinal and horizontal, may also be used. The optical NAND gate 700 is similar in function to an electronic NAND gate, but operates within the optical domain instead of the electrical domain. The electrical NAND comprises at least two inputs (inputs A and B) and an output. The electrical NAND may be constructed using an open-collector OR gate and two inverters to provide the following logical functionality of DeMorgan's Theorem ($\overline{X}$+$\overline{Y}$=$\overline{XY}$).

As mentioned above, the optical NAND gate 700 is the equivalent of the electrical NAND gate except that it operates within the optical domain. As shown in FIG. 7A, the optical NAND comprises a first VLSOA 710 having an input A 712 on which an optical signal enters the first VLSOA 710. As this optical signal is amplified, a ballast laser signal 718 is emitted from the first VLSOA 710. As previously described, this ballast laser signal 718 is inversely related to the strength of the optical signal. The optical NAND 700 also comprises a second VLSOA 715 having an input B 717 on which an optical signal enters the second VLSOA 715. Similar to the first VLSOA 710, the second VLSOA 715 emits a ballast laser signal 719 in response to the amplification process of this optical signal. The two ballast laser signals 718, 719 are combined into a single output signal 720 on the optical NAND 700.

The output 720 on the optical NAND 700 will go high if either input A 712 and/or input B 717 is low. This result is caused by the inverse relationship of the ballast laser signal emitted from the VLSOA and the optical signal that is amplified. Specifically, if an input on a VLSOA is low, the vertical lasing cavity within the VLSOA will remain below saturation and output a ballast laser signal. However, if an input on a VLSOA is high, the vertical lasing cavity within the VLSOA will saturate, causing the laser within the vertical laser cavity to extinguish and driving the ballast laser signal to approximately zero.

This optical NAND (as well as other optical logic devices) provides a building block for optical digital circuits that have typically only been created within the electrical domain. Accordingly, devices such as flip-flops and buffers that have typically only operated within an electrical domain may be designed to operate within an optical domain.

FIG. 7B is an illustration of an embodiment of an optical flip-flop 722 using the above-described optical NAND gate. This particular optical flip-flop 722 is the optical equivalent of an SR flip-flop that is commonly used by those skilled in the art.

The optical flip-flop 722 is created by cross-coupling two optical NAND gates resulting in a latch. A first NAND gate 725 comprises a first input that is a trigger, in this instance a set, and a second input cross-coupled to an output on the second NAND gate 730. The second NAND gate 730 comprises a first input that is also a trigger, in this instance a reset, and a second input cross-coupled to an output on the first NAND gate 725. The two outputs Q and Q-bar correspond to a state in the optical flip-flop 722.

The optical flip-flop 722 is considered set when Q is high and Q-bar is low. Comparatively, the optical flip-flop 722 is considered reset when Q is low and Q-bar is high. At rest, the flip-flop 722 holds state when both set and rest are high. A table is shown within FIG. 17B describing the logical input/output relationship of the optical flip-flop 722. Accordingly, the optical flip-flop 722 may change state or hold state according to the inputs (i.e., set and reset) on the two VLSOAs 725, 730. This optical flip-flop 722, as well as other optical flip-flops that use the same or other logic devices, may be used to create a memory device that operates within the optical domain.

Figure 7C:
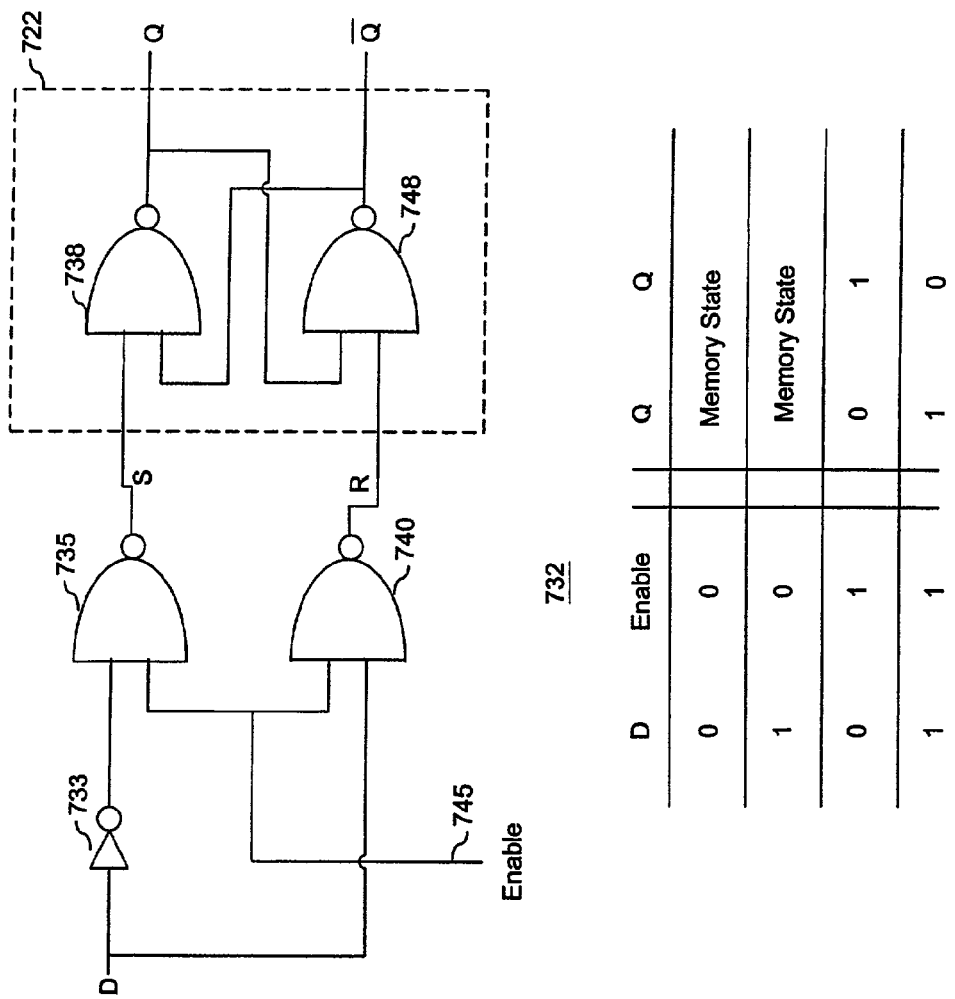
FIG. 7C is a block diagram of an optical buffer element according to the present invention.

FIG. 7C is an illustration of an embodiment of an optical buffer element 732 using the above-described optical flip-flop 722. The optical buffer element 732 comprises an optical flip-flop 722 and an enable control. The enable control comprises a first optical NAND 735, a second optical NAND 740, an inverter 733, and an enable line 745. The first optical NAND 735 has a first input coupled to an output on the inverter 733 and a second input coupled to the enable line 745. The input on the inverter 733 is coupled to data line, D. The second optical NAND 740 has a first input coupled to data line, D, and a second input coupled to the enable line 745.

The enable 745 controls the state on the optical flip-flop 722. Specifically, when enable 745 goes low, the optical flip-flop 722 is at rest or in a memory state. Accordingly, the optical flip-flop 722 may store a state or value (e.g., high or low) for a period of time. When enable goes high, the optical flip-flop 722 may acquire a logic level that is on the data line, D. Thus, logic levels may progress out of and be acquired by the optical flip-flop 722 according to the level on the enable line 745. A logic table is shown in FIG. 7C that more clearly defines the logical relationship between the levels on data line D, the enable line 745, and the status of the optical flip-flop 722. This optical buffer element 732 provides a building block for large memory devices that operate solely within an optical domain.

Figure 7D:
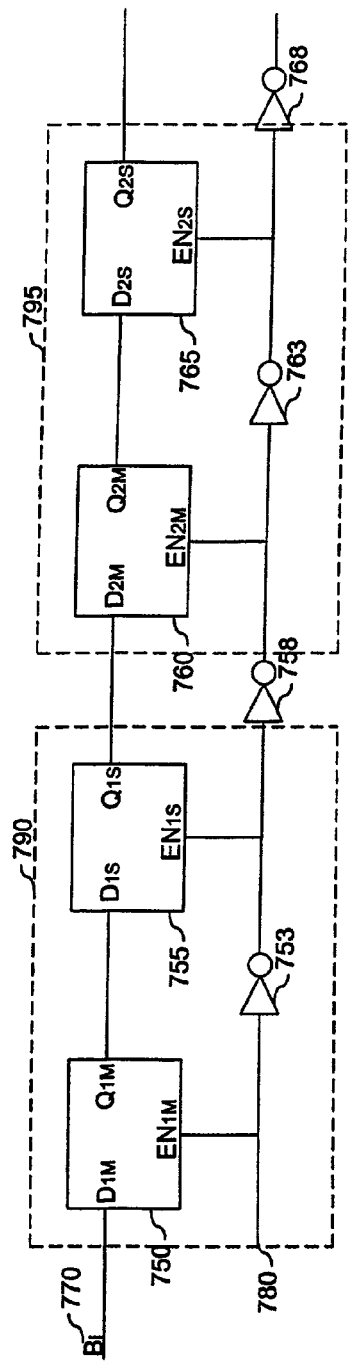
FIG. 7D is a block diagram of an optical buffer array according to the present invention.

FIG. 7D is an illustration of an embodiment of an optical buffer array 775 comprising a plurality of the above-described optical buffer element 732. Specifically, a first optical buffer element 750 is coupled in series to a second optical buffer element 755. The second optical buffer element 755 is coupled in series to a third optical buffer element 760. The third optical buffer element 760 is coupled in series to a fourth optical buffer element 765. One skilled in the art will recognize that the size of the buffer may be modified by simply adjusting the number of optical buffer elements included within the buffer array 775.

The optical buffer array 775 functions within the optical domain similar to an electrical first-in first-out (FIFO) buffer. The optical buffer array is controlled by a control line 780 on which a clock propagates. This control line 780 controls the progression of states or logic levels through the optical buffer array 775. One skilled in the art will recognize that the clocking rate on this control line 780 should be equal to or greater than the rate at which a data stream 770 enters the buffer array 775 in order to avoid packet loss at the input of the buffer array 775.

As previously described, each optical buffer element comprises a data line (D), an enable line (EN), and an output (Q). For example, the first optical buffer element 750 has a data line coupled to the data stream 770, an enable coupled to the control line 780, and an output coupled to a data line on the second optical buffer element 755. Logic levels propagate from one optical buffer element to the next as the clock on the control line 780 oscillates. One embodiment of the optical buffer is a master/slave flip-flop design. This particular design provides a redundancy within the optical buffer array 775.

Accordingly, as shown in the logic table, a first logic level B1 propagates from a first combination master/slave optical flip-flop 790 to a second combination master/slave optical flip-flop 795 in one entire clocking cycle. This propagation may be halted by simply holding the level on the control line 780 at low, which will place each optical flip-flop in rest. Propagation may then be continued by restarting the clocking signal on the control line 780. One skilled in the art will recognize that various optical storage device may be designed using the above-described principles. Additionally, this storage device may be controlled in different ways. For example, an optical buffer array may be designed using edge-triggered optical flip-flops instead of triggering the optical flip-flop at the set and reset inputs.

e) Method for Routing Packets Through an Optical Crossbar

Figure 8:
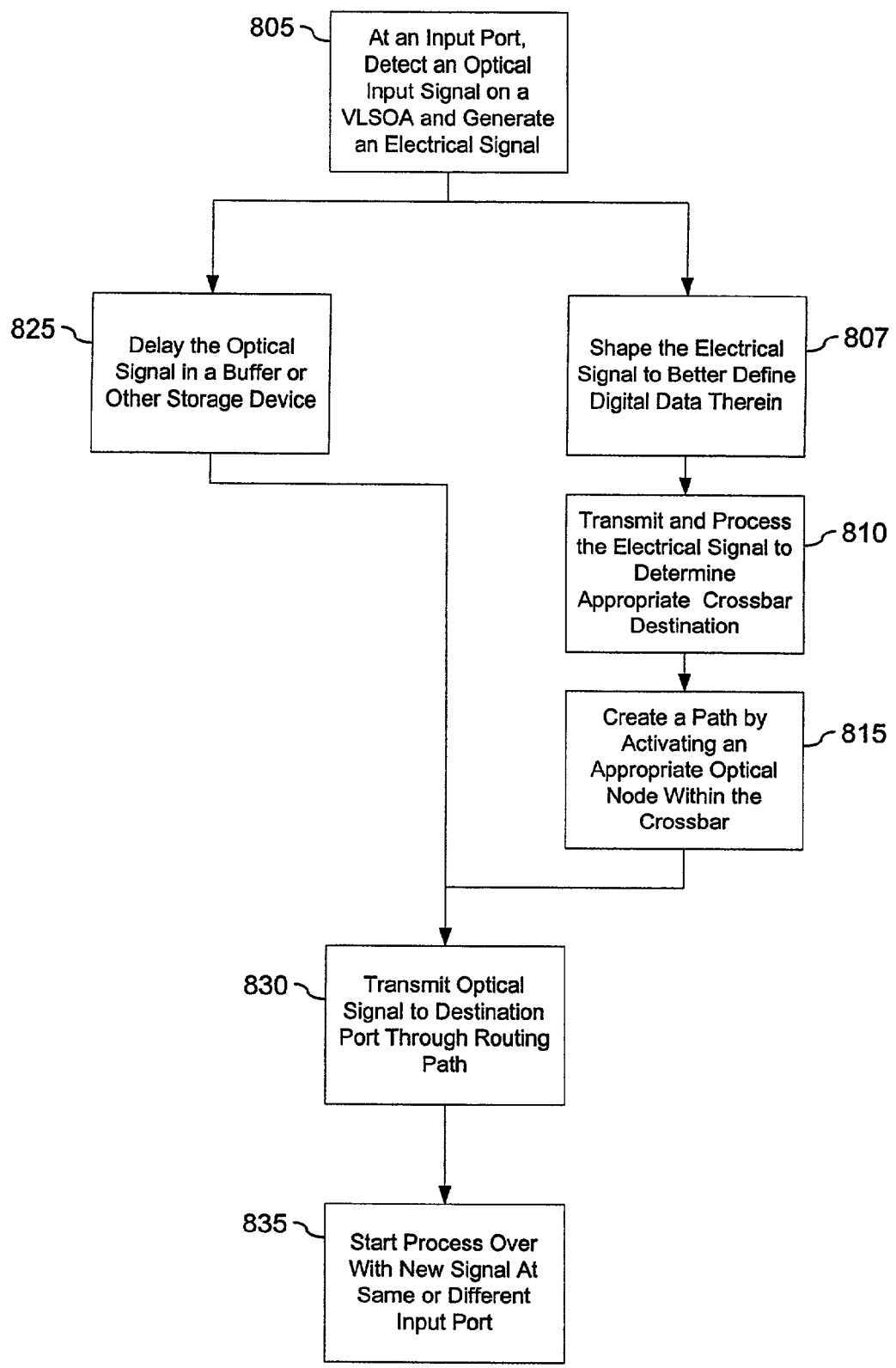
FIG. 8 is a flowchart showing a routing process used to transmit optical signals through the optical crossbar.

FIG. 8 shows a method for routing packets through an optical crossbar wherein the number of electrical components are minimized. The first step 805 is converting routing information within an optical signal to an electrical signal. This step may be done in a number of different methods. For example, all of the optical signal may be converted to an electrical signal. Another example includes identifying routing information (e.g., data within a particular channel), separating the routing information from the optical signal and converting it to an electrical signal. As described above, the conversion may be done by a detector 110 that converts a ballast laser signal emitted from a lasing SOA during amplification of the optical signal.

The electrical signal may be reshaped by a signal shaping device, such as a Schmitt trigger, in order to more clearly define digital data therein 807. The use of the signal-shaping device is optional and depends on the sensitivity requirements of the system. The ballast laser signal already contains addressing information in digital format even though the actual emission from a lasing SOA is an analog process (i.e., digital signals may be sent over analog line much in the same manner that digital cell phones use analog transmission for actual radio signal). Additionally, although rare, a system may substitute or supplement the shaping device with an analog-to-digital converter (not shown). In this instance, the electrical signal is converted to a digital signal using an analog-to-digital (A/D) converter.

The electrical signal is transmitted to the processor 155 to determine 810 an appropriate output on the optical crossbar for the optical signal. In this determination, information within a header of a packet may be analyzed. For example, the packet's destination address may be used in order to determine an appropriate output on the optical crossbar. Also, routing information may be contained within a channel or group of channels in the optical signal. In this instance, the routing information within the channel corresponding to the optical signal is analyzed to determine an appropriate output.

Once an output is determined, the processor 155 creates 815 a path from the buffer containing the optical signal to the appropriate output on the optical crossbar. This path is created by activating an optical routing node 170 within the optical crossbar. An optical routing node 170 is activated by pumping an optical amplifier 630 so that an optical signal may propagate through the optical amplifier without attenuating below a certain level. In particular, the optical amplifier 630 should apply a gain greater than 1 so that the optical signal is amplified in the optical amplifier. If the optical amplifier 630 is not pumped sufficiently, then the optical signal will be unable to pass through the optical amplifier 630 resulting in corresponding path being blocked.

In order for the optical signal to be properly transmitted through the optical crossbar, the optical signal is delayed 825 to allow sufficient time for the processor to create an appropriate path. This delay may be accomplished using a number of different methods. For example, an optical buffer that creates a time delay N*t, as described above, may be used or a fiber coil of sufficient length. Additionally, a static optical buffer may be used where optical flip-flops are implemented that are able to hold states statically. Finally, more traditional methods such as electrical storage device such as FIFO buffers or RAM modules may be used. However, if these electrical storage devices are used then the optical signal must be converted to an electrical signal prior to storage and converted back to an optical signal prior to transmission into the optical crossbar.

Once the optical signal has been sufficiently delayed and a path has been created, the optical signal is transmitted 830 from the buffer to the optical crossbar. Thereafter, the optical travels along the path the processor 155 created and propagates out the appropriate output on the optical crossbar. Once the optical signal has traveled through the optical crossbar and been transmitted from the appropriate output, the processor 155 deactivates the optical node 170 on the path traveled by the optical signal. The optical node 170 is deactivated by turning off the pump current on line 160. This process is repeated when another optical signal arrives at the input or may be performed simultaneously at other inputs on the optical crossbar.

While the present invention has been described with reference to certain embodiments, those skilled in the art will recognize that various modifications may be provided. For example, various other types of lasing semiconductor optical amplifiers may be used in replace of a VLSOA within the above-described embodiments. These lasing semiconductor optical amplifiers include longitudinal lasing semiconductor optical amplifiers and transverse lasing semiconductor optical amplifiers. Variations upon and modifications to the embodiments are provided for by the present invention, which is limited only by the following claims.

We claim:

1. An optical crossbar switch comprising:
   an optical crossbar having a plurality of inputs and outputs for reconfigurably coupling the inputs to the outputs;
   a lasing SOA coupled to an input of the optical crossbar for amplifying an optical signal, wherein the lasing SOA outputs a ballast laser signal which acts as a ballast with respect to amplification of the optical signal;
   a monitor circuit coupled to receive the ballast laser signal from the lasing SOA for generating an electrical signal from the ballast laser signal, the electrical signal containing addressing information for the optical signal; and
   a processor coupled to the monitor circuit and the optical crossbar for reconfiguring the optical crossbar according to the addressing information.

2. The optical crossbar switch of claim 1 further comprising an optical buffer coupled between the lasing SOA and the optical crossbar, the optical buffer adapted to store data within the optical signal.

3. The optical crossbar switch of claim 2 wherein the optical buffer comprises a plurality of optical flip-flops.

4. The optical crossbar switch of claim 3 wherein each optical flip-flop in the plurality of optical flip-flops stores a state within the optical signal.

5. The optical crossbar switch of claim 3 wherein an optical flip-flop in the plurality of the optical flip-flops comprises:
   a first lasing SOA coupled to an optical flip-flop set interface;
   a second lasing SOA coupled to the first lasing SOA and an optical flip-flop reset interface, wherein a state on the optical flip-flop is controlled by the set interface and the reset interface.

6. The optical crossbar switch of claim 1 further comprising an electrical buffer coupled to the lasing SOA and the optical crossbar.

7. The optical crossbar switch of claim 6 wherein the electrical buffer comprises:
   a first optical-to-electrical converter coupled to an output on the lasing SOA, the optical-to-electrical converter adapted to covert the optical signal to an equivalent electrical signal; and
   an electrical buffer coupled to the first converter and the optical crossbar, the electrical buffer adapted to store the equivalent electrical signal; and
   an electrical-to-optical converter coupled to the electrical buffer, the electrical-to-optical converter adapted to convert the equivalent electrical signal to the optical signal.

8. The optical crossbar switch of claim 1 further comprising a signal-shaping device, coupled to the monitor circuit and the processor, that clarifies digital data within the electrical signal.

9. The optical crossbar switch of claim 8 wherein the signal-shaping device comprises a Schmitt trigger.

10. The optical crossbar switch of claim 1 wherein the lasing SOA is a vertical lasing SOA.

11. The optical crossbar switch of claim 1 wherein the lasing SOA is a longitudinal lasing SOA.

12. The optical crossbar switch of claim 1 wherein the at least one lasing SOA is a transverse lasing SOA.

13. The optical crossbar switch of claim 1 wherein the detector comprises an avalanche photodiode.

14. The optical crossbar switch of claim 1 wherein the monitor circuit comprises a PIN diode.

15. The optical crossbar switch of claim 1 wherein the monitor circuit is integrated on a ballast laser light-emitting surface of the lasing SOA.

16. The optical crossbar switch of claim 1 wherein a plurality of channels is in the optical signal and at least one channel contains routing information.

17. The optical crossbar switch of claim 16 wherein the routing information within the optical signal is contained within a single wavelength band.

18. The optical crossbar switch of claim 1 wherein the processor and the optical crossbar switch are integrated on a single chip.

19. The optical crossbar switch of claim 1 wherein the optical crossbar comprises a plurality of optical nodes wherein at least one optical node is used to reconfigurably create a path between an input and an output on the optical crossbar.

20. The optical crossbar switch of claim 1 wherein the at least one optical node comprises:
- an optical wavelength demultiplexer for dropping an optical channel from the optical signal;
- an optical amplifier coupled to the optical wavelength demultiplexer for amplifying a dropped channel; and
- an optical combiner coupled to the optical amplifier for combining the dropped channel onto an output on the optical crossbar.

21. The optical crossbar switch of claim 20 wherein the optical channel comprises a plurality of wavelengths.

22. The optical crossbar switch of claim 20 wherein the optical amplifier within the at least one optical node activates an output in the optical crossbar for the dropped channel.

23. The optical crossbar switch of claim 1 wherein the at least one optical node comprises:
- an optical splitter for diverting a portion of the optical signal towards a particular output on the optical crossbar;
- an optical amplifier coupled to the optical splitter for amplifying the diverted optical signal; and
- an optical combiner coupled to the optical amplifier for combining the diverted optical signal onto an output on the optical crossbar.

24. The optical crossbar switch of claim 23 wherein the optical splitter comprises an integrated tap coupler.

25. The optical crossbar switch of claim 23 wherein the optical amplifier within the at least one optical node activates an output in the optical crossbar for the diverted optical signal.

26. An optical signal switching system comprising:
- an optical crossbar having a plurality of inputs for receiving optical signals and a plurality of outputs for transmitting optical signals;
- a plurality of optical nodes within the optical crossbar, the optical nodes adapted to control an optical path from an input to a corresponding output;
- a plurality of lasing SOAs coupled to the plurality of inputs wherein at least one lasing SOA is coupled to an input;
- a plurality of monitor circuits coupled to the plurality of lasing SOAs wherein at least one monitor circuit is coupled to a lasing SOA; and
- a plurality of buffers coupled to the pluralities of inputs and lasing SOAs wherein at least one buffer is coupled between a lasing SOA and an input.

27. The optical signal switching system of claim 26 wherein the plurality of buffers comprise optical buffers.

28. The optical signal switching system of claim 26 wherein the plurality of buffers comprise electrical buffers.

29. The optical signal switching system of claim 26 wherein the plurality of lasing SOAs comprises a vertical lasing SOA.

30. The optical signal switching system of claim 26 wherein the plurality of lasing SOAs comprises a transverse lasing SOA.

31. The optical signal switching system of claim 26 wherein the plurality of lasing SOAs comprises a longitudinal lasing SOA.

32. The optical signal switching system of claim 26 wherein the plurality of monitor circuits comprises an avalanche photodiode.

33. The optical signal switching system of claim 26 wherein the plurality of monitor circuits comprises a PIN diode.

34. The optical signal switching system of claim 26 wherein at least one monitor circuit of the plurality of monitor circuits and at least one lasing SOA of the plurality of lasing SOAs is integrated on a single chip.

35. The optical signal switching system of claim 26 further comprising a processor coupled to at least one monitor circuit and at least one optical node, the processor adapted to create a path through the optical crossbar in response to an electrical signal received from the monitor circuit.

36. The optical signal switching system of claim 35 further comprising an optical shaping device, coupled to the at least one monitor circuit and the processor, that clarifies digital data within the electrical signal.

37. A method for switching an optical signal, the method comprising the steps of:
- receiving an optical signal in a lasing SOA;
- emitting a ballast laser signal from the lasing SOA in response to the received optical signal;
- converting the ballast laser signal to an electrical signal;
- creating a path through an optical crossbar in response to the electrical signal; and
- transmitting the optical signal along the created path through the optical crossbar.

38. The method of claim 37 further comprising the step of storing the optical signal as the path through the optical crossbar is created.

39. The method of claim 38 wherein the optical signal is stored in an optical buffer.

40. The method of claim 38 wherein the optical signal is stored in an electrical buffer.

41. The method of claim 40 wherein the step of storing the optical signal comprises:
- converting the optical signal to an electrical signal;
- storing the electrical signal in an electrical memory device; and
- converting the stored electrical signal to an optical signal after the path through the optical crossbar is created.

42. The method of claim 37 wherein the lasing SOA is a vertical lasing SOA.

43. The method of claim 37 wherein the lasing SOA is a transverse lasing SOA.

44. The method of claim 37 wherein the lasing SOA is a longitudinal lasing SOA.

45. The method of claim 37 wherein a routing channel within the ballast laser light is converted to an electrical signal.

46. The method of claim 37 wherein the step of creating a path through an optical crossbar in response to the electrical signal, further comprises:
- diverting a portion of the optical signal onto a different path at an optical node;
- transmitting the diverted portion of the optical signal on the different path by activating an SOA; and
- outputting the diverted portion of the optical signal from the different path.

47. The method of claim 46 wherein the diverted portion of the optical signal is a dropped channel.

* * * * *

UNITED STATES PATENT AND TRADEMARK OFFICE
CERTIFICATE OF CORRECTION

PATENT NO.         : 7,046,434 B1
APPLICATION NO. : 10/020527
DATED                  : May 16, 2006
INVENTOR(S)        : DiJaili et al.

It is certified that error appears in the above-identified patent and that said Letters Patent is hereby corrected as shown below:

Title Page
Item 56, Page 2, Other Publications, Column 1, Line 42, change "Jong" to --Jeong--

Drawings
Sheet 2, change "Figure 2" to the figure depicted herein below, wherein the reference "201" has been removed.

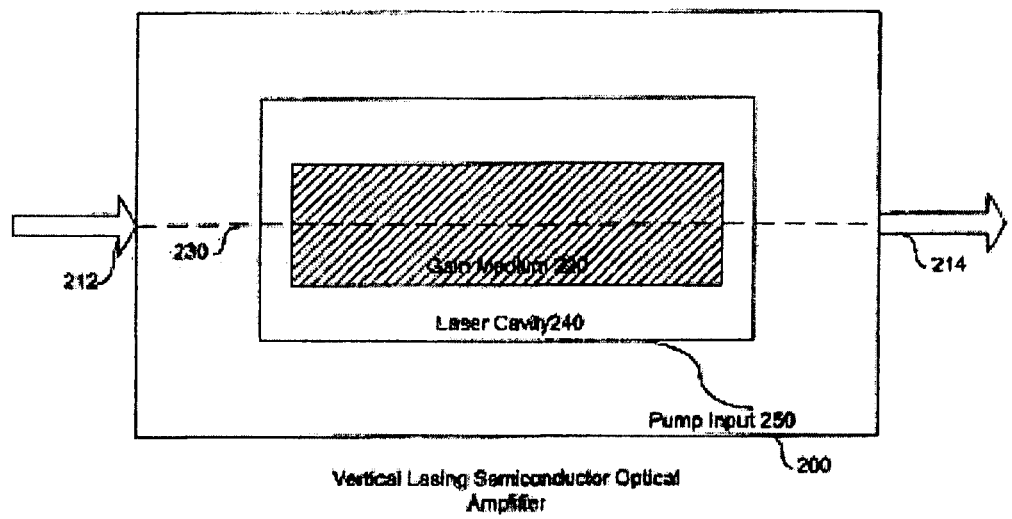

Figure 2

Signed and Sealed this

Thirtieth Day of November, 2010

David J. Kappos
*Director of the United States Patent and Trademark Office*

CERTIFICATE OF CORRECTION (continued)
U.S. Pat. No. 7,046,434 B1

Drawings
Sheet 6, change "Figure 4C" to the figure depicted herein below, wherein the Top Cladding Layer has been labeled --407--

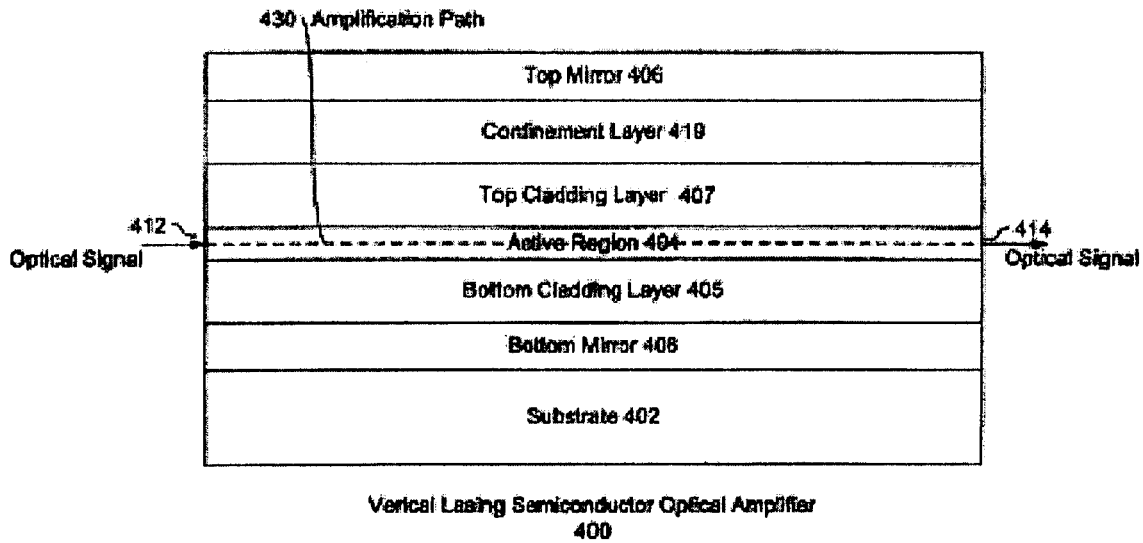

Vertical Lasing Semiconductor Optical Amplifier
400

Figure 4C

Drawings
Sheet 11, change "Figure 7A" to the figure depicted herein below, wherein the NAND gate has been labeled --700--

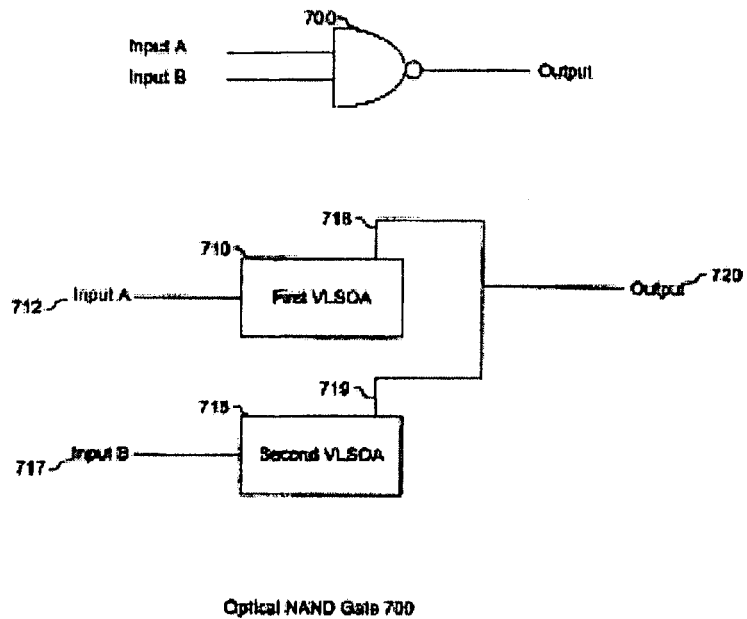

Optical NAND Gate 700

Figure 7A

CERTIFICATE OF CORRECTION (continued)
U.S. Pat. No. 7,046,434 B1

Drawings
Sheet 12, change "Figure 7B" to the figure depicted herein below, wherein the 2$^{nd}$ and 3$^{rd}$ row of the outputs have been change to --1-- and --0--, and --0-- and --1--, respectively.

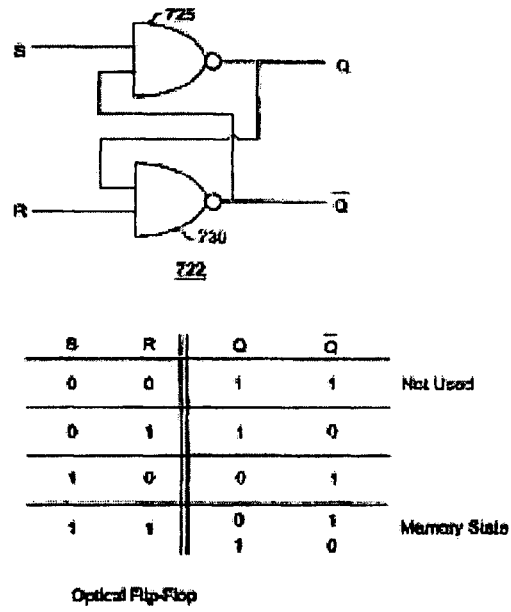

Optical Flip-Flop
Figure 7B

Drawings
Sheet 13, change "Figure 7C" to the figure depicted herein below, wherein the 3$^{rd}$ and 4$^{th}$ row of the outputs have been change to --1-- and --0--, and --0-- and --1--, respectively.

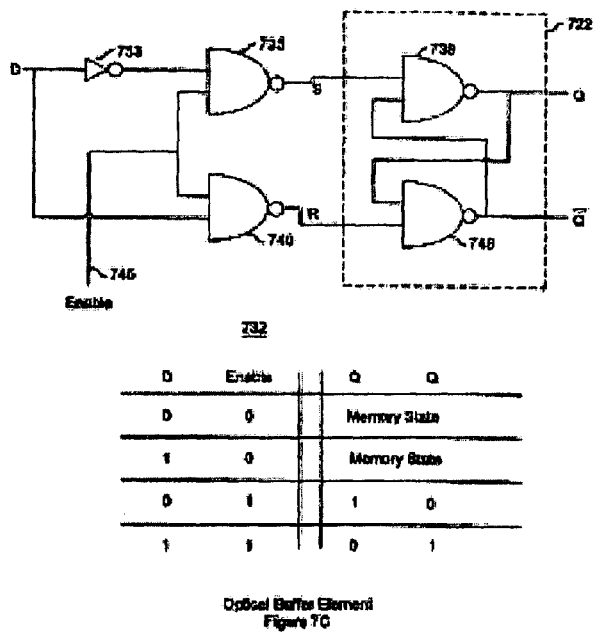

Optical Buffer Element
Figure 7C

Column 4
Line 53, change "115" to --110--

Column 11
Line 5, change "421" to --412--
Line 24, change "410" to --310--
Line 25, change "220" to --320--
Line 40-41, change "10 dB" to --20 dB--
Line 43, change "30 dB" to --60 dB--

Column 12
Line 17, change "510" to --110--

Column 15
Line 18, change "FIG. 17B" to --FIG. 7B--